(12) United States Patent
Kamei et al.

(10) Patent No.: US 6,707,720 B2
(45) Date of Patent: Mar. 16, 2004

(54) NONVOLATILE SEMICONDUCTOR STORAGE DEVICE

(75) Inventors: Teruhiko Kamei, Yokohama (JP); Masahiro Kanai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 75 days.

(21) Appl. No.: 10/157,896

(22) Filed: May 31, 2002

(65) Prior Publication Data

US 2003/0072193 A1 Apr. 17, 2003

(30) Foreign Application Priority Data

Jun. 4, 2001 (JP) .................................. 2001-168374

(51) Int. Cl.⁷ .............................................. G11C 16/04
(52) U.S. Cl. .............................. 365/185.33; 365/185.23
(58) Field of Search ........................ 365/185.33, 185.23, 365/185.05, 103, 189.09

(56) References Cited

U.S. PATENT DOCUMENTS

| | | | |
|---|---|---|---|
| 5,111,428 A | 5/1992 | Liang et al. | |
| 5,268,861 A | 12/1993 | Hotta | |
| 5,315,541 A | 5/1994 | Harari et al. | |
| 5,345,416 A | 9/1994 | Nakagawara | |
| 5,408,115 A | 4/1995 | Chang | |
| 5,422,504 A | 6/1995 | Chang et al. | |
| 5,494,838 A | 2/1996 | Chang et al. | |
| 5,969,383 A | 10/1999 | Chang et al. | |
| 6,177,318 B1 | 1/2001 | Ogura et al. | |
| 6,248,633 B1 | 6/2001 | Ogura et al. | |
| 6,255,166 B1 | 7/2001 | Ogura et al. | |

FOREIGN PATENT DOCUMENTS

| | | | |
|---|---|---|---|
| JP | A 7-161851 | 6/1995 | |
| JP | B1 2978477 | 9/1999 | |
| JP | A 2001-156188 | 6/2001 | |

OTHER PUBLICATIONS

Hayashi et al., "Twin MONOS Cell with Dual Control Gates", 2000 Symposium on VLSI Technology Digest of Technical Papers.

Chang et al., "A New SONOS Memory Using Source–Side Injection for Programming", IEEE Electron Device Letters, vol. 19, No. 7, 1998.

Chen et al., "A Novel Flash Memory Device with S Plit Gate Source Side Injection and ONO Charge Storage Stack (SPIN)", 1997 Symposium on VLSI Technology Direct Technical Papers.

U.S. patent application Ser. No. 09/955,160, Kanai et al., filed Sep. 19, 2001.

U.S. patent application Ser. No. 09/955,158, Kanai et al., filed Sep. 19, 2001.

U.S. patent application Ser. No. 10/115,956, Kamei, filed Apr. 5, 2002.

U.S. patent application Ser. No. 10/115,913, Kamei, filed Apr. 5, 2002.

U.S. patent application Ser. No. 10/153,736, Owa, filed May 24, 2002.

U.S. patent application Ser. No. 10/153,611, Owa, filed May 24, 2002.

U.S. patent application Ser. No. 10/157,897, Kamei et al., filed May 31, 2002.

U.S. patent application Ser. No. 10/153,686, Owa, filed May 24, 2002.

*Primary Examiner*—David Nelms
*Assistant Examiner*—Long Tran
(74) *Attorney, Agent, or Firm*—Oliff & Berridge, PLC

(57) ABSTRACT

When data is read from one of the memory elements in a memory cell [i] in a reverse read mode, a word line WL1 is set at a supply voltage Vdd, a control gate CG [i+1] is set at 1.5V, and a control gate CG [i] is set at an override voltage (for example, 3V). When a bit line BL [I+1] is 0V and a bit line BL [i] is connected to a sense amplifier, the gate voltage BS0 of a bit line selection transistor located midway of the bit line BL [i] is set at a high voltage (for example, 4.5V), in order to ensure current which flows through the bit line BL [i] connected to the drain of the memory cell [i]. Since the voltage of the bit line BL [i+1] connected to the source of the memory cell [i] becomes a value close to 0V (on the order of several tens to hundred mV), the back gate of a bit line selection transistor exerts little influence, and hence, the gate voltage BS1 of this bit line selection transistor is set at the supply voltage Vdd.

12 Claims, 29 Drawing Sheets

Erase (Unselected Block)

NONVOLATILE SEMICONDUCTOR STORAGE DEVICE

Japanese Patent Application No. 2001-168374, filed on Jun. 4, 2001, is hereby incorporated by reference in its entirety.

BACKGROUND OF THE INVENTION

The present invention relates to a nonvolatile semiconductor storage device constructed of memory cells each including two nonvolatile memory elements which are controlled by one word gate and two control gates.

Known as a nonvolatile semiconductor device is the MONOS (Metal-Oxide-Nitride-Oxide-Semiconductor or -Substrate) type wherein the gate insulator layer between a channel and a gate is formed of a stacked structure consisting of a silicon oxide film, a silicon nitride film and a silicon oxide film, and wherein electric charges are trapped in the silicon nitride film.

The MONOS type nonvolatile semiconductor storage device is disclosed in a publication, Y. Hayashi, et al.: 2000 Symposium on VLSI Technology, Digest of Technical Papers, p.122 to p.123. The publication teaches a MONOS flash memory cell including two nonvolatile memory elements (also termed "MONOS memory elements or cells") which are controlled by one word gate and two control gates. That is, one flash memory cell has two trap sites for charges.

A plurality of MONOS flash memory cells each having such a structure are arranged in each of a row direction and a column direction, thereby to construct a memory cell array region.

Two bit lines, one word line and two control gate lines are required for driving the MONOS flash memory cell. In driving a large number of memory cells, however, such lines can be connected in common in a case where even the different control gates are set at the same potential.

Here, when the bit line is shared by the large number of memory cells, the load thereof enlarges, and the high speed drive of the storage device is impossible. Moreover, the storage device dissipates more electric power and becomes unsuited to portable equipment etc.

These problems can be solved in such a way that the bit lines are divided into a main bit line and sub bit lines, and that only the sub bit line connected to the memory cell within a block area to-be-selected is connected to the main bit line through a bit line selection transistor.

With this method, however, the gate voltage of the bit line selection transistor must be boosted in order that current to flow through the bit line may be ensured especially as in a data read mode.

BRIEF SUMMARY OF THE INVENTION

The present invention may provide a nonvolatile semiconductor storage device in which a control voltage for a bit line selection switching element is lowered by analyzing the operation of a read operation from memory cells.

One aspect of the present invention relates to a nonvolatile semiconductor storage device comprising:

a memory cell array region in which a plurality of memory cells are arranged in a first direction and a second direction intersecting with each other, each of the memory cells having first and second nonvolatile memory elements and being controlled by one word gate and first and second control gates;

a plurality of sub bit lines which extend in the first direction and are disposed in a plurality of block areas formed by dividing the memory cell array region in the first direction, each of the sub bit lines being connected with the first nonvolatile memory element of one of two the memory cells adjacent each other in the second direction and the second nonvolatile memory element of the other of the two memory cells;

a plurality of main bit lines which are formed extending over the plurality of block areas arranged in the first direction, each of the main bit lines being connected in common to the plurality of sub bit lines respectively disposed in the block areas arranged in the first direction;

a plurality of bit line selection switching elements which are respectively disposed at connection points between the main bit lines and the sub bit lines, and select connection or non-connection based on a control voltage; and a bit line selection driver which supplies the control voltage to the bit line selection switching elements.

The plurality of bit line selection switching elements include a first group of bit line selection switching elements and a second group of bit line selection switching elements, respectively connected with every second line among the sub bit lines arranged in the second direction.

The bit line selection driver include a first bit line selection driver which supplies a first control voltage to the first group of bit line selection switching elements, and a second bit line selection driver which supplies a second control voltage to the second group of bit line selection switching elements.

The first bit line selection driver supplies the first group of bit line selection switching elements with the first control voltage that is set to be lower than the second control voltage when data is read out of one of the first and second nonvolatile memory elements, and a bit line selection switching element connected to the sub bit line serving as a source of selected one of the memory cells is included in the first group of bit line selection switching elements.

The second bit line selection driver supplies the second group of bit line selection switching elements with the second control voltage that is set to be lower than the first control voltage when data is read out of the other of the first and second nonvolatile memory elements, and a bit line selection switching element connected to the sub bit line serving as a source of selected one of the memory cells is included in the second group of bit line selection switching elements.

According to the one aspect of the present invention, in a data read mode or a data program mode, only the sub bit lines selected by the bit line selection switching elements are connected to the main bit lines, so that the loads of the bit lines are reduced to permit a high speed operation.

Besides, when data is read from a selected cell (selected one of first and second nonvolatile memory elements), current flows through the sub bit line which serves as a drain in the memory cell including the selected cell, and hence, the control voltage of the bit line selection switching element arranged midway of the sub bit line needs to be heightened.

On the other hand, the voltage of the bit line connected to the source of the memory cell becomes close to 0V. Therefore, the back gate of the bit line selection transistor connected to the sub bit line serving as the source exerts little influence, and the control voltage of this transistor need not be made so high as the control voltage on the drain side. In this manner, the control voltage of one bit line selection switching element can be made low, so that the load of a booster circuit (charge pump) for generating the high voltage can be lightened.

Between the first and second control voltages, a lower voltage may be set at a supply voltage, and a higher voltage may be set at a voltage generated by boosting the supply voltage. The current on the drain side can be ensured by employing the supply voltage as the low voltage, and the low voltage need not to be generated by boosting.

Data may be read out in a reverse read mode by using a source which is the sub bit line connected to a selected element between the first and second nonvolatile memory elements, the data being read out of the selected element, and by using a drain which is the sub bit line connected to an unselected element between the first and second nonvolatile memory elements, the data not being read out of the unselected element.

Alternatively, data may be read out in a forward read mode by using a drain which is the sub bit line connected to a selected element between the first and second nonvolatile memory elements, the data being read out of the selected element, and by using a source which is the sub bit line connected to an unselected element between the first and second nonvolatile memory elements, the data not being read out of the unselected element.

The nonvolatile semiconductor storage device may further comprise a bit line selection voltage control circuit which supplies the first and second control voltages to the first and second bit line selection drivers, respectively.

The nonvolatile semiconductor storage device may further comprise a predecoder which predecodes an address signal for specifying one of the first and second nonvolatile memory elements from which data is to be read out. In this case, the bit line selection voltage control circuit may set each of the first and second control voltages at one of the lower voltage and the higher voltage in accordance with a predecoded output from the predecoder.

Each of the first and second bit line selection drivers may be disposed in respective one of the plurality of block areas arranged in the first direction. In this case, the bit line selection voltage control circuit may supply the first and second control voltages to the first and second bit line selection drivers, respectively.

The nonvolatile semiconductor storage device may further comprise a global decoder which collectively selects the block areas arranged in the second direction, based on the predecoded output delivered from the predecoder. In this case, the first and second bit line selection drivers may supply the first and second control voltages to the first and second groups of bit line selection switching elements, respectively, when a decoded output from the global decoder is active.

The first and second bit line selection drivers may be respectively arranged in local driver areas which are adjacent to the block areas in the second direction.

In this case, an odd-numbered block area and an even-numbered block area among the block areas arranged in the second direction may be disposed adjacent each other between two of the local driver areas among the local driver areas arranged in the second direction.

On this occasion, the first group of bit line selection switching elements and the second groups of bit line selection switching elements may respectively be connected to every second line among the sub bit lines arranged in the second direction in the odd-numbered block area and the even-numbered block area.

The first bit line selection driver, which drives the first groups of bit line selection switching elements, may be disposed in one of the local driver areas which is adjacent to the odd-numbered block area, and the second bit line selection driver, which drives the second groups of bit line selection switching elements, may be disposed in another of the local driver areas which is adjacent to the even-numbered block area.

Each of the first and second nonvolatile memory elements may include an ONO film formed of an oxide film (O), a nitride film (N) and an oxide film (O), as a trap site for electric charges. However, the nonvolatile memory elements are not limited to such as structure, and other structures can be adopted.

DETAILED DESCRIPTION OF THE EMBODIMENT

Figure 1:
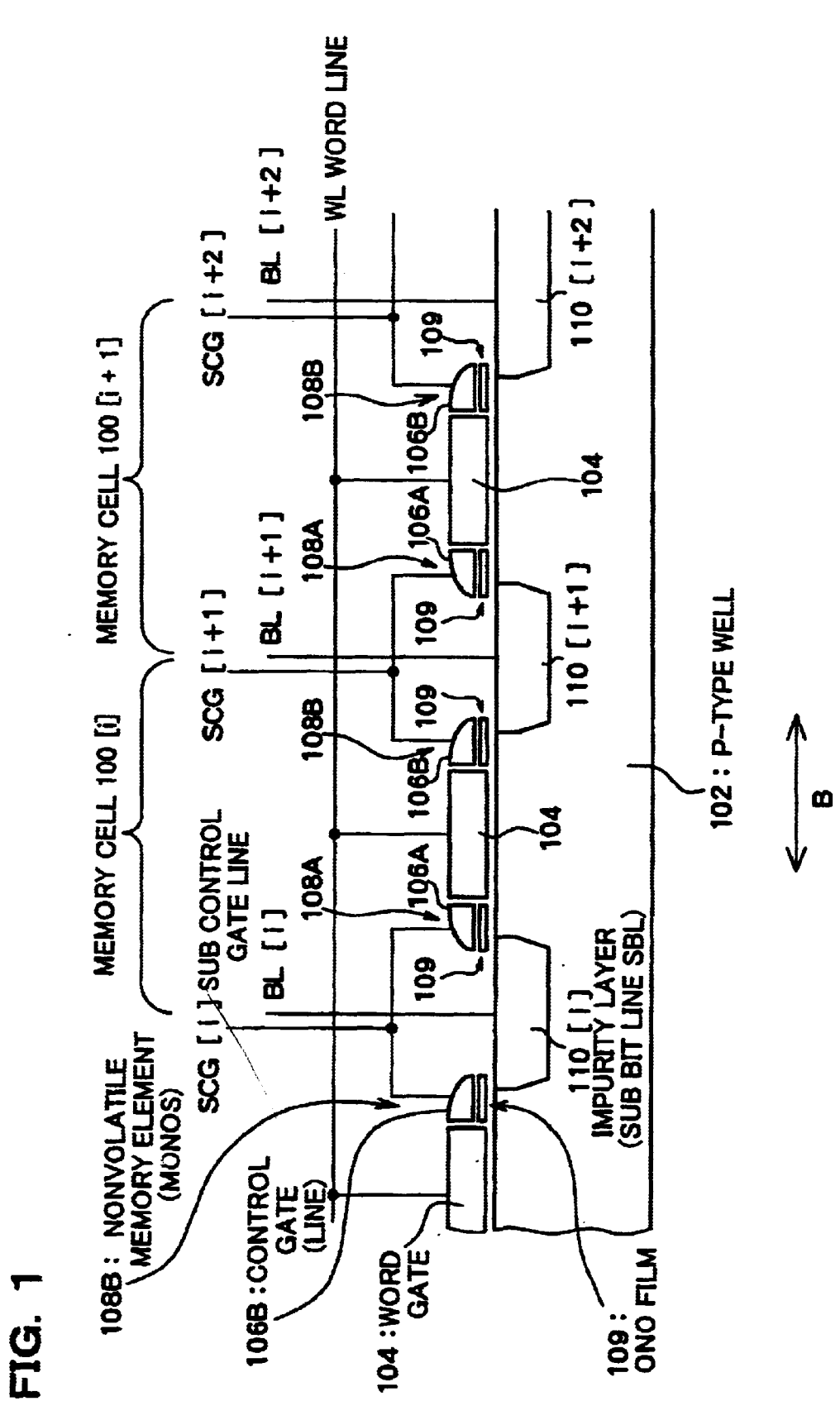
FIG. 1 is a sectional view of memory cells applied to a nonvolatile semiconductor storage device according to an embodiment of the present invention.

Now, an embodiment of the present invention will be described with reference to the drawing.

Memory Cell

FIG. 1 shows one section of a nonvolatile semiconductor storage device. Referring to the figure, a memory cell 100 includes a word gate 104 which is formed from a material containing, for example, polysilicon, over a P-type well 102 and through a gate oxide film, first and second control gates 106A and 106B, and first and second memory elements (MONOS memory elements) 108A and 108B.

The first and second control gates 106A, 106B are formed at both the sidewalls of the word gate 104, and they are electrically insulated from the word gate 104, respectively.

Each of the first and second memory elements 108A, 108B is constructed by stacking an oxide film (O), a nitride film (N) and an oxide film (O) between the corresponding one of the first and second control gates 106A, 106B, which are formed of the polysilicon corresponding to the M (metal) of "MONOS", and the P-type well 102. Incidentally, the first and second control gates 106A, 106B can also be made of a conductive material such as silicide.

In this manner, one memory cell 100 includes the first and second MONOS memory elements 108A, 108B having the split gates (first and second control gates 106A, 106B), and one word gate 104 is shared by the first and second MONOS memory elements 108A, 108B.

The first and second MONOS memory elements 108A, 108B function as charge trap sites, respectively. Each of the first and second MONOS memory elements 108A, 108B is capable of trapping electric charges by an ONO film 109.

As shown in FIG. 1, a plurality of word gates 104 which are arranged at intervals in a row direction (a second direction B in FIG. 1) are connected in common to one word line WL which is formed of a polycide or the like.

The control gates 106A, 106B shown in FIG. 1 extend in a column direction (a first direction A perpendicular to the sheet of FIG. 1), and they are shared by a plurality of memory cells 100 which are arranged in the column direction. Therefore, the parts 106A, 106B shall be also termed "control gate lines".

A sub control gate line SCG [i+1] which is formed of a metal layer overlying the word gate, control gates and word line by way of example is connected to the control gate line 106B of the [i]th memory cell 100 [i] and the control gate line 106A of the [i+1]th memory cell 100 [i+1].

The P-type well 102 is provided with an [i+1]th impurity layer 110 [i+1] which is shared by the MONOS memory element 108B of the [i]th memory cell 100 [i] and the MONOS memory element 108A of the [i+1]th memory cell 100 [i+1].

Each of such impurity layers 110 [i], [i+1] and [i+2] is, for example, an N-type impurity layer which is formed in the P-type well, which extends in the column direction (the first direction A perpendicular to the sheet of FIG. 1), and which functions as a sub bit line shared by the plurality of memory cells 100 arranged in the column direction. Therefore, the parts 110 [i], [i+1] and [i+2] shall be also termed "sub bit lines SBL [i], [i+1] and [i+2]".

Overall Construction of Nonvolatile Semiconductor Storage Device

The general construction of the nonvolatile semiconductor storage device constructed using the above memory cells 100 will be described with reference to FIGS. 2A to 2E.

Figure 2:
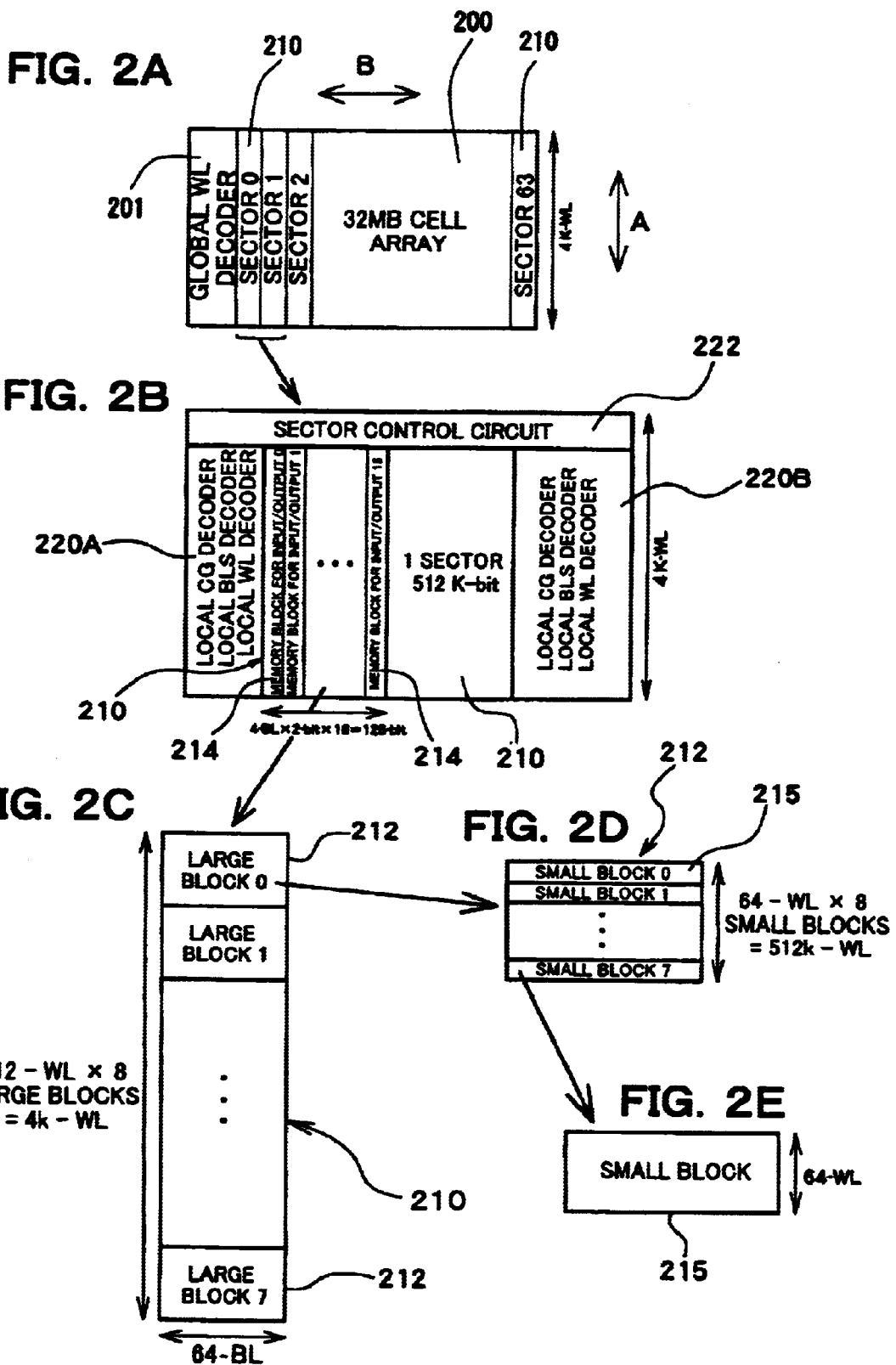
FIG. 2A is a plan view of an overall layout of the nonvolatile semiconductor storage device shown in FIG. 1.
FIG. 2B is a plan view of two sector areas in FIG. 2A.
FIG. 2C is a plan view of one memory block in FIG. 2B.
FIG. 2D is a plan view of one large block in FIG. 2C.
FIG. 2E is a plan view of one small block in FIG. 2D.

FIG. 2A is a plan layout view of the nonvolatile semiconductor storage device of single chip, which includes a memory cell array region 200 and a global word line decoder 201. The memory cell array region 200 includes, for example, 0th to 63rd sector areas 210 in the total number of 64.

As shown in FIG. 2A, the 64 sector areas 210 are obtained by dividing the memory cell array region 200 in the second direction (row direction) B, and each sector area 210 has a vertically longer shape whose longitudinal direction is the first direction (column direction). A minimum section for erasing data is each sector area 210, and data stored in the sector areas 210 are erased collectively or in time division.

The memory array area 200 has, for example, 4 k word lines WL and 4 k bit lines BL. Here in this embodiment, the two MONOS memory elements 108A, 108B are connected to one bit line BL, and hence, the 4 k bit lines BL signify a storage capacity of 8 kbits. The storage capacity of each sector area 210 is equal to 1/64 of the storage capacity of the whole memory, and the latter storage capacity is defined by (4 k word lines WL)×(64 bit lines BL)×2.

FIG. 2B shows the details of the two adjacent 0th and 1st sector areas 210 of the nonvolatile semiconductor storage device shown in FIG. 2A. As shown in FIG. 2B, local driver areas (each including a local control gate driver, a local bit line selection driver and a local word line driver) 220A and 220B are arranged on both the sides of the two sectors 210. Besides, a sector control circuit 222 is arranged on, for example, the upper sides of the two sectors 210 and the two local driver areas 220A, 220B.

Each sector area 210 is divided in the row direction, into 16 memory blocks (memory blocks corresponding to input/output bits) 214 for I/O 0 to I/O 15 so that data of 16 bits can be read and written. As shown in FIG. 2B, each memory block 214 has 4 k (4096) word lines WL.

As shown in FIG. 2C, each sector area 210 shown in FIG. 2B is divided into eight large blocks 212 in the column direction A. As shown in FIG. 2D, each large block 212 is divided into eight small blocks 215 in the column direction A.

Each small block 215 has 64 word lines WL as shown in FIG. 2E.

Details of Sector Area

Figure 3:
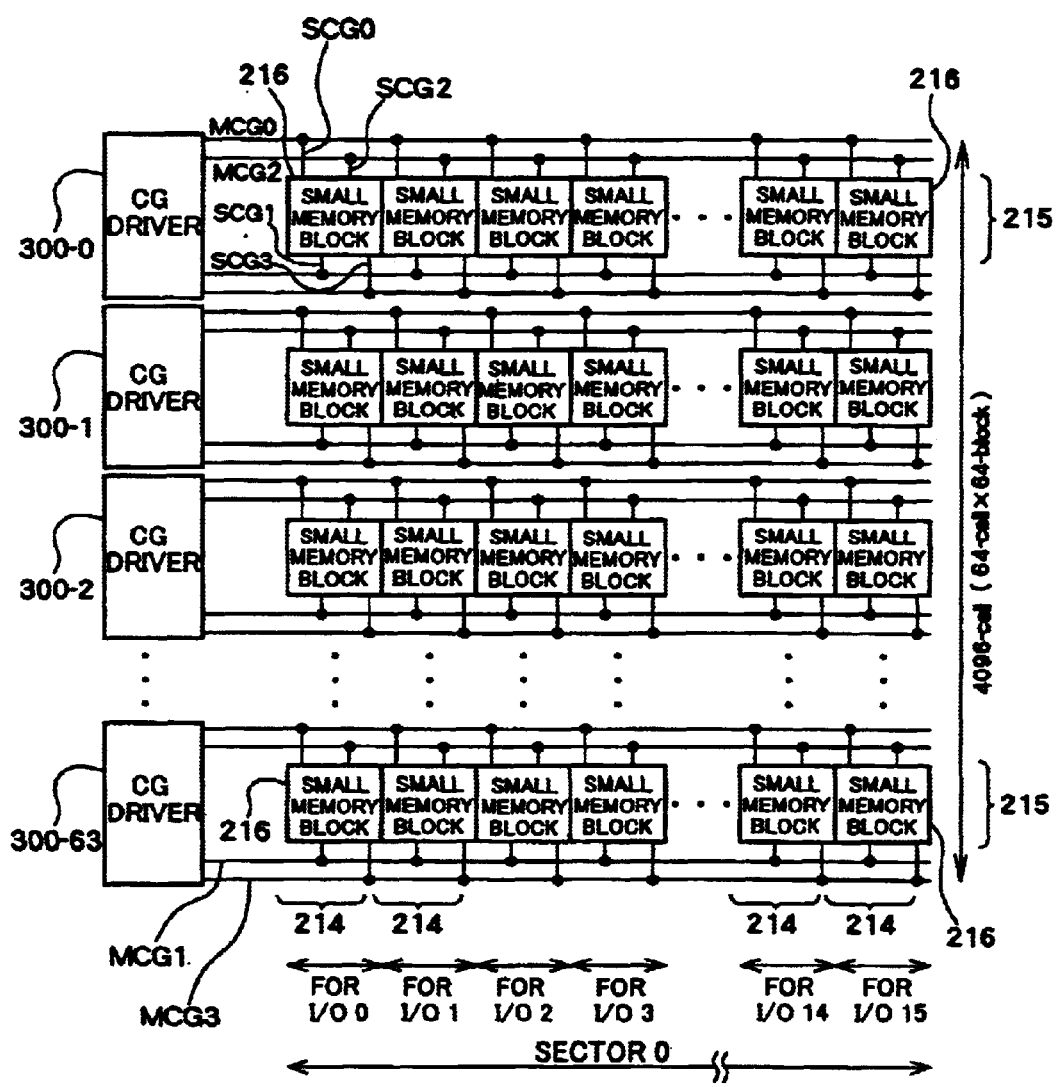
FIG. 3 is a schematic diagram explaining the large number of small memory blocks of one sector area shown in FIG. 2B and the wiring lines thereof.
Figure 4:
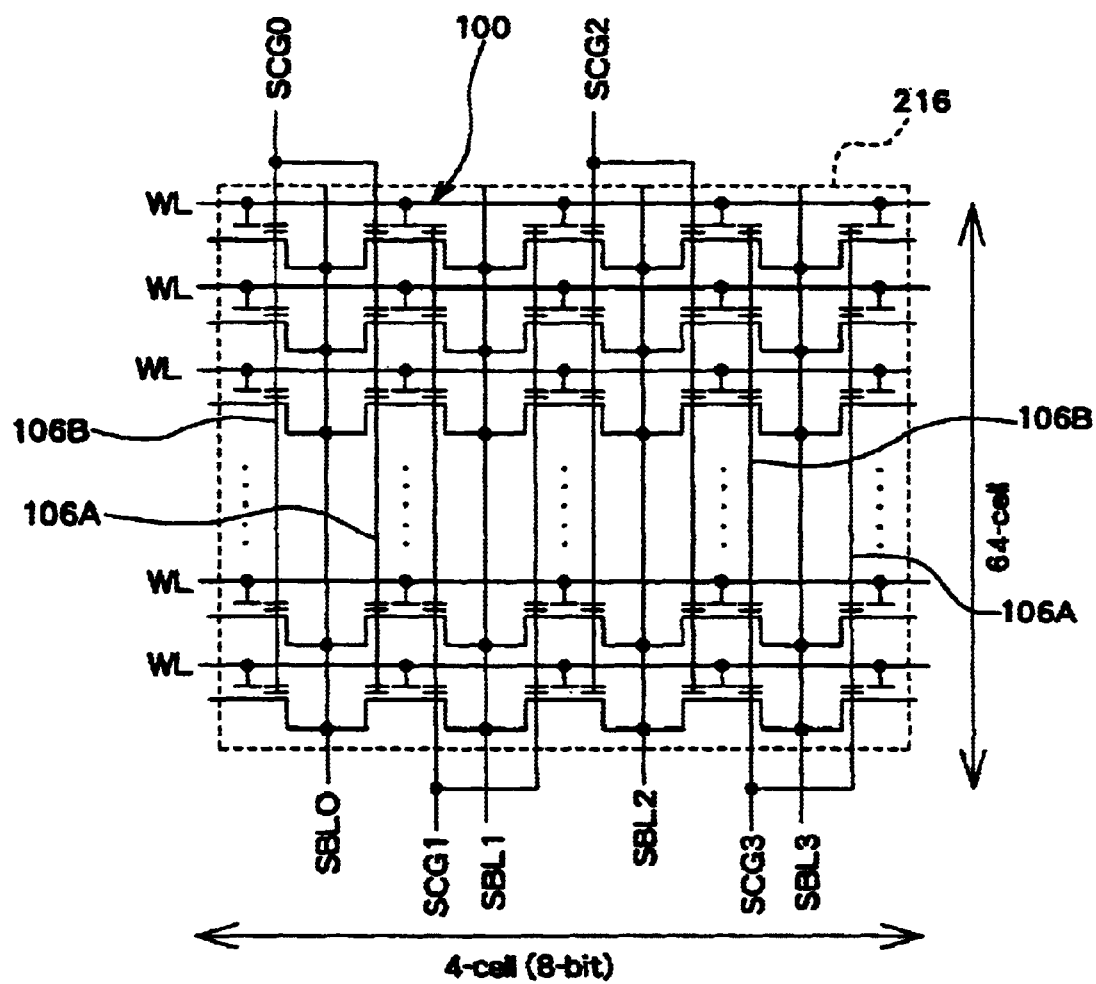
FIG. 4 is a circuit diagram of the small memory block shown in FIG. 3.

FIG. 3 shows the details of the sector area 0 shown in FIG. 2A. A small memory block 216 shown in FIG. 3 is constructed by arranging the memory cells 100 in the number of, for example, 64 in the column direction and in the number of, for example, 4 in the row direction as shown in FIG. 4. By way of example, four sub control gate lines SCG 0 to SCG 3, four sub bit lines SBL 0 to SBL 3 being data input/output lines, and 64 word lines WL are connected to one small memory block 216.

Here, the second control gates 106B of the respective memory cells of the even-numbered column (0th column or second column), and the first control gates 106A of the respective memory cells of the odd-numbered column (first column or third column) are connected in common to the even-numbered sub control gate line SCG 0 or SCG 2. Likewise, the second control gates 106B of the respective memory cells of the odd-numbered column (first column or third column), and the first control gates 106A of the respective memory cells of the even-numbered column (second column or fourth column) are connected in common to the odd-numbered sub control gate line SCG 1 or SCG 3.

As shown in FIG. 3, the small memory blocks 216 are arranged in the number of 64 in the column direction (each column forms the small block 215) within one memory block 214, and the 16 memory blocks 214 corresponding to the 16 inputs/outputs, I/O 0 to I/O 15 are arranged in the row direction in order to input/output 16 bits.

The 16 sub control gate lines SCG 0 of the 16 small memory blocks 216 arranged in the row direction are connected in common to a main control gate line MCG 0 laid in the row direction. Likewise, the 16 sub control gate lines SCG 1 are connected in common to a main control gate line MCG 1, the 16 sub control gate lines SCG 2 to a main control gate line MCG 2, and the 16 sub control gate lines SCG 3 to a main control gate line MCG 3.

The corresponding one of CG drivers 300-0 through 300-63 constituting a control gate drive section is disposed in each small block 215 within the sector area 0. The four main control gate lines MCG 0 to MCG 3 extending in the row direction are connected to each of the CG drivers 300-0 through 300-63.

Figure 5:
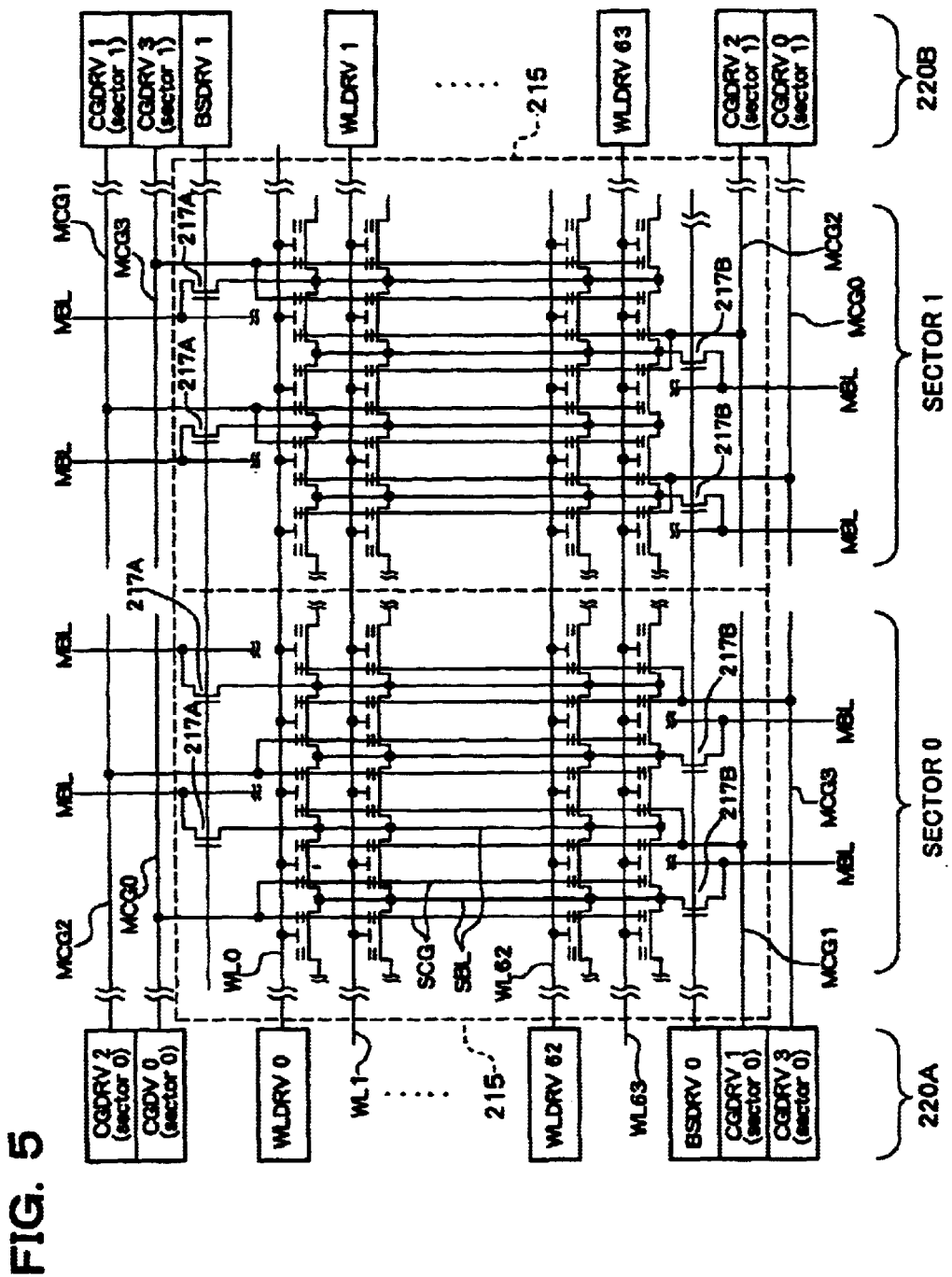
FIG. 5 is a diagram showing the relationship between small blocks and local driver areas shown in FIG. 3.

FIG. 5 shows the relationship between the two small blocks 215 which belong to the sector areas 0 and 1 adjacent to each other, respectively. In the sector areas 0 and 1, the 64 word lines WL 0 to WL 63 are shared, but the main control gate lines MCG 0 to MCG 3 and main bit lines MBL are laid independently of each other. Particularly in FIG. 5, CG drivers CGDRV 0 to 3 corresponding to the small block 215 in the sector area 0, and CG drivers CGDRV 0 to 3 corresponding to the small block 215 in the sector area 1 are shown, and the CG drivers are disposed independently for the respective small blocks 215.

All the sub bit lines SBL 0 (impurity layers) arranged every small block 215 are connected in common to the main bit line MBL which is a metal wiring line. The main bit line MBL is shared among the small memory blocks 216 which are arranged in the column direction (the first direction A). Bit line selection gates 217A or 217B which are bit line selection switching elements are arranged midway of respective paths which lead from the main bit line MBL to the corresponding sub bit lines SBL 0 in the small memory blocks 216. Byway of example, the bit line selection gates 217A are respectively connected to the odd-numbered sub bit lines SBL, whereas the bit line selection gates 217B are respectively connected to the even-numbered sub bit lines SBL.

Figure 6:
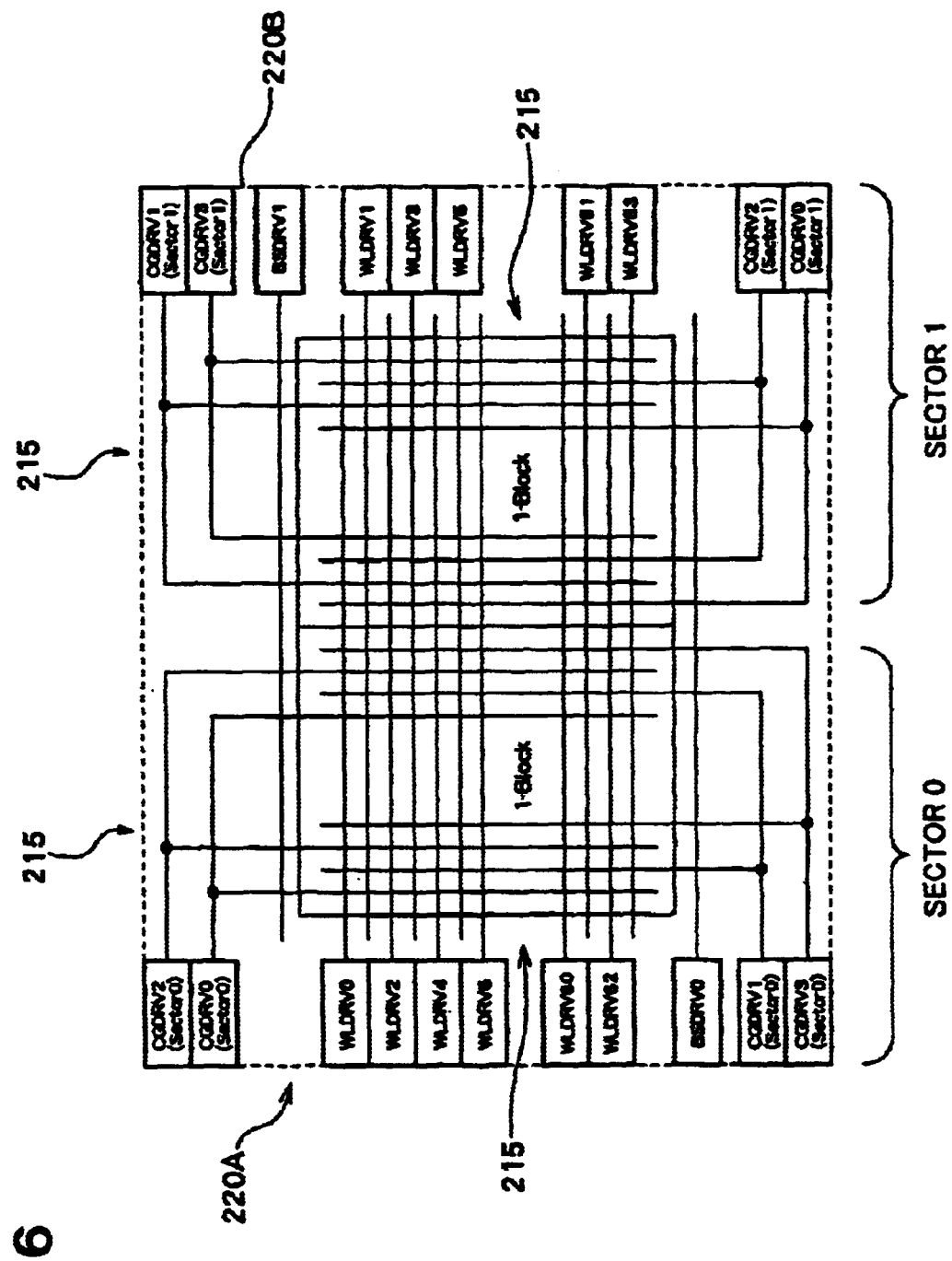
FIG. 6 is a schematic diagram explaining the relationship between the two small blocks in two adjacent sectors and the local driver areas.

The two small blocks 215 in the two, 0th and first sector areas 210 adjacent to each other, and the local driver areas 220A, 220B on both the sides thereof are shown in detail in FIG. 6. As shown in FIG. 6, the four local control gate line drivers CGDRV 0 to CGDRV 3 shown in FIG. 5 are arranged in the left local driver area 220A. Likewise, the four local control gate line drivers CGDRV 0 to CGDRV 3 shown in FIG. 5 are arranged in the right local driver area 220B.

Besides, local word line drivers WLDRV 0, . . . , WLDRV 62 which drive the even-numbered word lines WL 0, 2, . . . , 62 in the sectors 0, 1, respectively, are arranged in the left local driver area 220A. Local word line drivers WLDRV 1, . . . , WLDRV 63 which drive the odd-numbered word lines WL 1, 3, . . . , 63 in the sectors 0, 1, respectively, are arranged in the right local driver area 220B.

Further, as shown in FIGS. 5 and 6, a local bit line driver BSDRV 1 which drives the bit line selection gates 217A connected to, for example, the odd-numbered sub bit lines SBL of the sectors 0, 1 is arranged in the right local driver area 220B. A local bit line driver BSDRV 0 which drives the bit line selection gates 217B connected to, for example, the even-numbered sub bit lines SBL of the sectors 0, 1 is arranged in the left local driver area 220A.

Drive Circuits of Sectors 0 and 1

Figure 7:
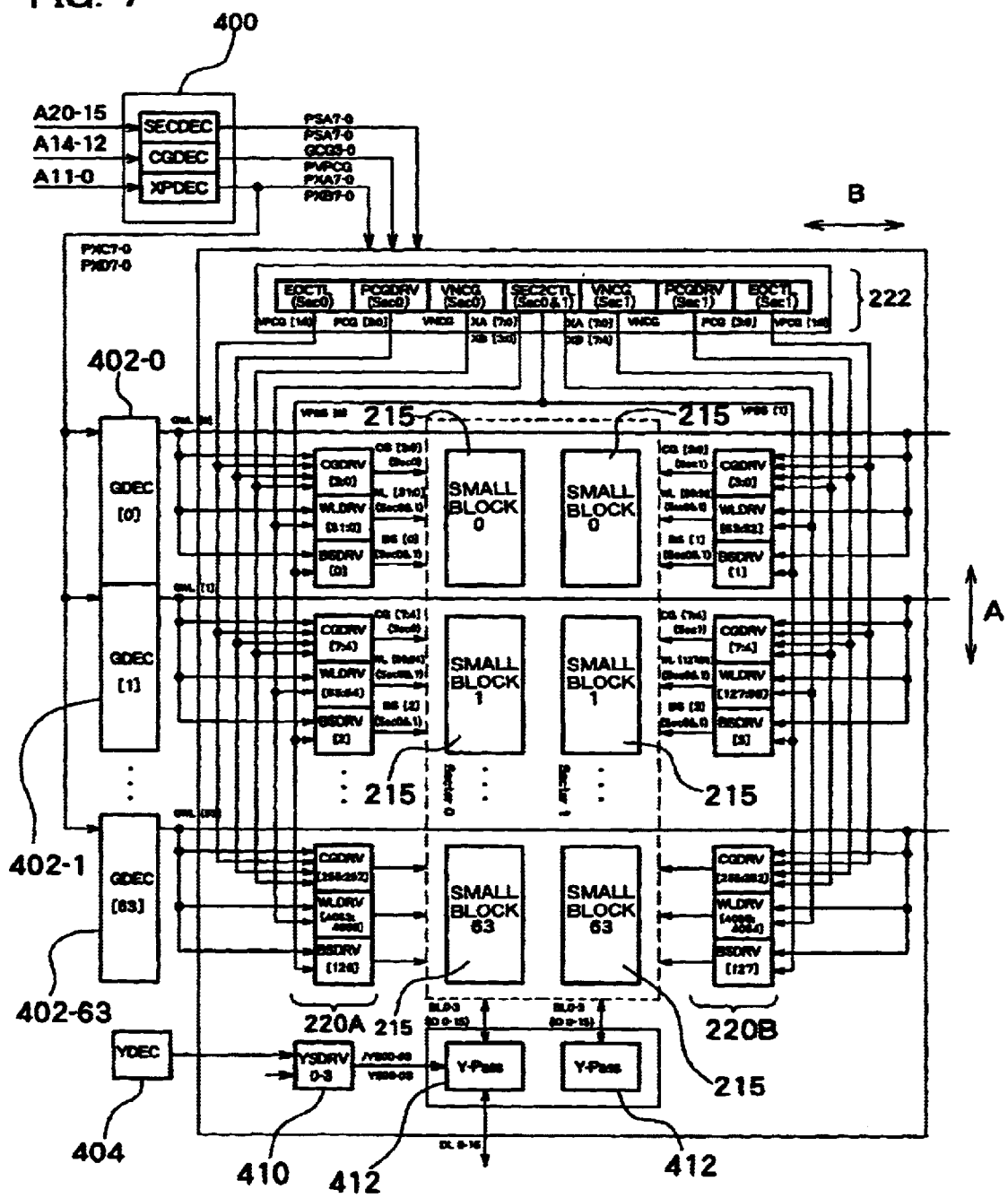
FIG. 7 is a block diagram showing the peripheral drive circuits of the two adjacent sectors.

Next, circuits which drive the memory cells in the respective small blocks 215 within the sectors 0, 1 will be described with reference to FIG. 7.

First, a predecoder 400, 64 global decoders 402-0 through 402-63, and a Y-decoder 404 are disposed as constituents which are shared by the sectors 0 to 63.

The predecoder 400 decodes an address signal A [20-0] which specifies a nonvolatile memory element to-be-selected (selected cell). The significances of the address signal A [20-0] will be indicated in Table 1 below.

TABLE 1

| ADDRESS | GROUP | FUNCTION | |
|---|---|---|---|
| A [20–15] | Sector | Choose 1 of 64 | |
| A [14–12] | Row | Choose 1 of 8 | |
| A [11–9] | Large block | Choose 1 of 8 | Choose 1 of 4096 |
| A [8–6] | Small block | Choose 1 of 8 | |
| A [5–0] | Column | Choose 1 of 64 | |

As indicated in Table 1, one of the 64 sectors is selected by the higher-order address signal A [20-15], one bit in four cells (8 bits) within one small memory block 216 shown in FIG. 4 is selected by the medium-order address signal A [14-12], and one of the 4096 word lines WL in one sector is selected by the lower-order address signal A [11-0]. More specifically, one of the eight large blocks 212 existing in one sector is selected by the address signal A [11-9], one of the eight small blocks 215 existing in one large block 212 is selected by the address signal A [8-6], and one of the 64 word lines WL existing in one small block 215 is selected by the address signal A [5-0].

The 64 global decoders 402-0 through 402-63 render 64 global word lines GWL [0] to GWL [63] active based on a result obtained by predecoding the lower-order address signal A[11-0] by means of the predecoder 400. Incidentally, only one global word line GWL is rendered active (Vdd) in each of a data read mode and a data program mode. All the 64 global word lines GWL are rendered active (Vdd) in a data erase mode in a case where data in one sector are collectively erased. For this reason, all the word lines WL in one sector are selected and are supplied with a word line voltage for erasing.

The Y-decoder 404 drives a Y-pass circuit 412 through a Y-pass selection driver 410, whereby the selected bit line in the small block 215 is connected to a sense amplifier or a bit line driver at a succeeding stage.

As already described with reference to FIGS. 5 and 6, the local driver areas 220A, 220B are disposed on both the sides of the small blocks 215 in FIG. 7.

In the case of the small memory blocks 0 at the first row in the sectors 0, 1, in the local driver area 220A on the left side of these blocks 0, there are arranged a control gate line driver CGDRV [3-0] which drives the four main control gate lines MCG in the sector 0, a word line driver WLDRV [31-0] which drives the 31 even-numbered word lines WL in the sectors 0, 1, and a bit line selection driver BSDRV [0] which drives the bit line selection transistors 217B connected to the even-numbered sub bit lines SBL in the sectors 0, 1. In the local driver area 220B on the right side, there are arranged a control gate line driver CGDRV [3-0] which drives the four main control gate lines MCG in the sector 1, a word line driver WLDRV [63-32] which drives the 31 odd-numbered word lines WL in the sectors 0, 1, and a bit line selection driver BSDRV [1] which drives the bit line selection transistors 217A connected to the odd-numbered sub bit lines SBL in the sectors 0, 1.

Next, the sector control circuit 222 arranged, for example, on the upper sides of the sectors 0, 1 will be described in detail with reference to FIG. 7.

Two control-gate-voltage control circuits EOCTL which are disposed in correspondence with the sectors 0, 1, respectively, output two sorts of high voltages VPCG [1:0] for the control gates, each of which is set at either potential VP1 or VP2, based on a predecoded output from the predecoder 400. That is, when one high voltage VPCG [0] for the control gates is the potential VP1, the other high voltage VPCG [1] for the control gates becomes the potential VP2.

Here, the voltages VP1, VP2 are generated by booster circuits (charge pumps) not shown, and they are set at boosted voltages which differ depending upon the modes. By way of example, VP1=1.5V and VP2=3V hold in the data read mode. On the other hand, VP1=5.5V and VP2=2.5V hold in the data program mode.

Figure 8:
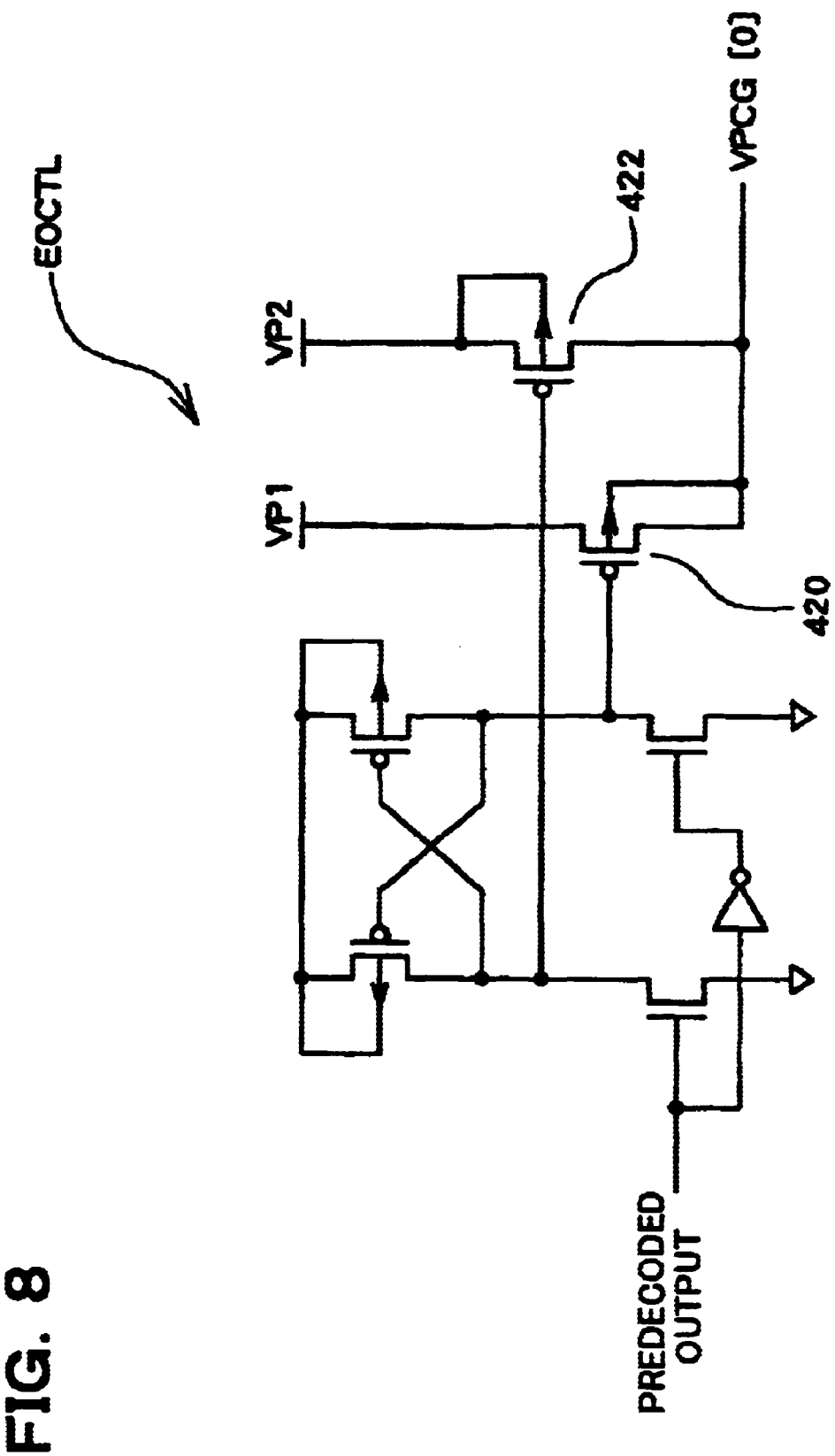
FIG. 8 is a circuit diagram showing an example of a control-gate-voltage control circuit EOCTL shown in FIG. 7.

FIG. 8 shows an example of a circuit which outputs the high voltage VPCG [0] for the control gates, in the control-gate-voltage control circuit EOCTL. Referring to FIG. 8, when the predecoded output is HIGH, a P-type MOS transistor 420 turns OFF, and a P-type MOS transistor 422 turns ON, so that the voltage VP2 is outputted as the high voltage VPCG [0] for the control gates. To the contrary, when the predecoded output is LOW, the P-type MOS transistor 420 turns ON, and the P-type MOS transistor 422 turns OFF, so that the voltage VP1 is outputted as the high voltage VPCG [0] for the control gates.

Two precontrol gate line drivers PCGDRV which are disposed in correspondence with the sectors 0, 1, respectively, output driver selection signals PCG [3: 0] each of which renders active any of the four control gate line drivers CGDRV 0 to 3 disposed in correspondence with the small blocks 215 in the corresponding sector 0 or 1, based on the predecoded output from the predecoder 400.

Figure 9:
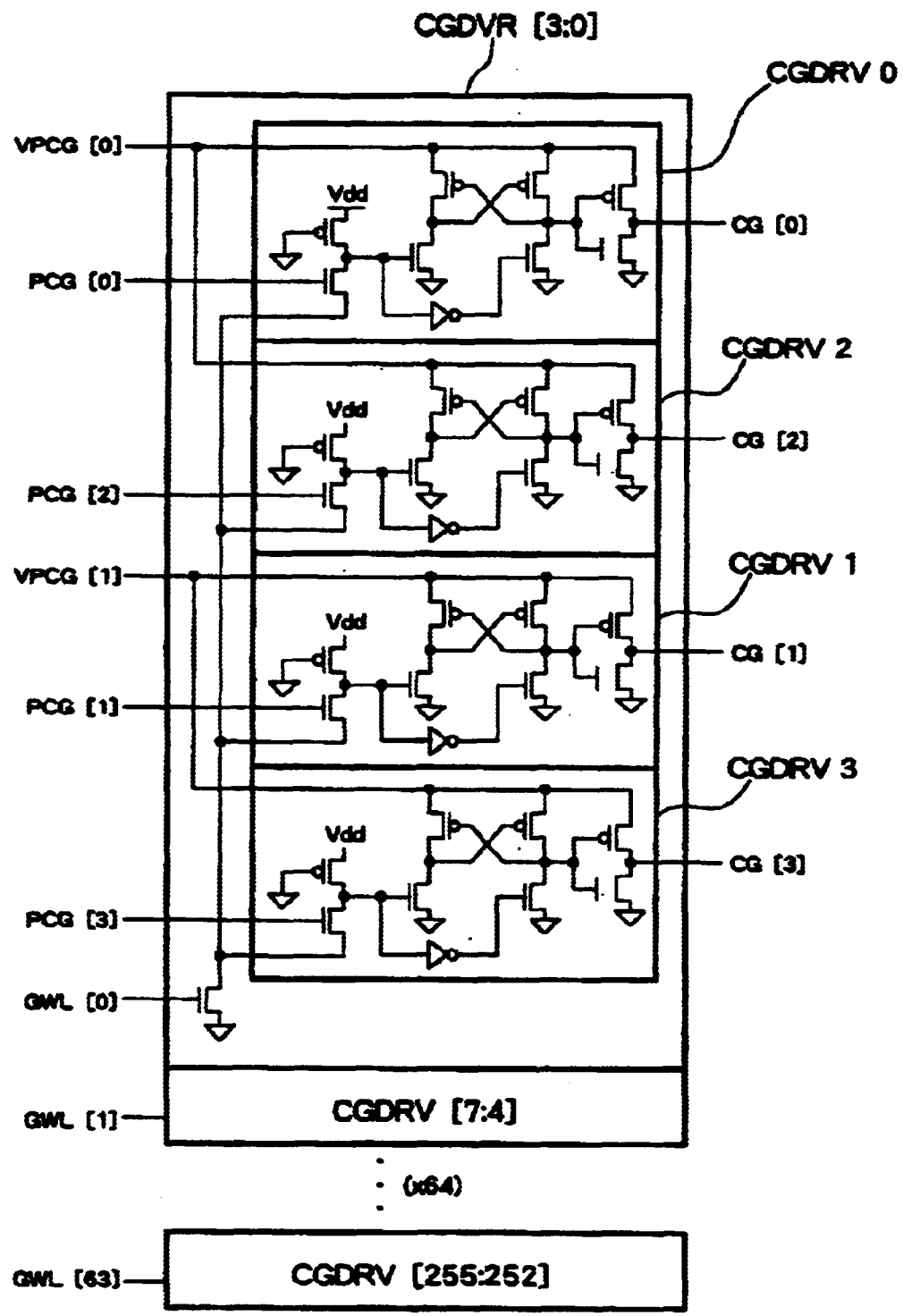
FIG. 9 is a circuit diagram showing an example of a control gate line driver CGDRV shown in FIG. 7.

Here, control gate line drivers CGDRV [3:0] to CGDRV [255:252] disposed in correspondence with the small blocks 0 to 63 in the sector 0 are shown in FIG. 9.

Referring to FIG. 9, the high voltage VPCG [0] for the control gates are inputted to the control gate line drivers CGDRV 0, 2, while the high voltage VPCG [1] for the control gates are inputted to the control gate line drivers CGDRV 1, 3.

Besides, driver selection signals PCG [3:0] are respectively inputted to the corresponding control gate line drivers CGDRV 0 to 3.

In the case of the control gate line driver CGDRV 0 as an example, the high voltage VPCG [0] for the control gates, being the voltage VP1 or VP2, is outputted from the control gate line driver CGDRV 0, only in a case where the global word line signal GWL [0] is HIGH and the driver selection signal PCG [0] is HIGH. In any other case, the output of the control gate line driver CGDRV 0 becomes 0V. This operation is also true of the other control gate line drivers.

Two negative voltage supply circuits VNCG for precontrol gates as are disposed in correspondence with the sectors 0, 1, respectively, supply a negative voltage VNCG (for example, −3V) to be applied to the control gates in the data erase mode, to the four control gate line drivers CGDRV 0 to 3 disposed in correspondence with the small blocks 215 in the corresponding sector 0 or 1, based on the predecoded output from the predecoder 400.

Although a circuit which supplies the negative voltage VNCG in the data erase mode is omitted from FIG. 9, it supplies the negative voltage VNCG to the control gates in all the small blocks 215 within the corresponding sector in the data erase mode, whereby data can be collectively erased every sector.

A 2-sector control circuit SEC2CTL which is disposed in common for the sectors 0, 1, outputs signals XA [7:0], XB [3:0] and XB [7:4] for selecting the word line drivers WLDRV disposed in correspondence with the respective small blocks 215 within the sectors 0, 1, and further outputs a voltage VPBS [1:0] for driving the bit line selection drivers BSDRV.

Here, the "signal XA [7:0] for selecting the word line drivers" corresponds to the address signal A [2:0], and it selects by a signal of 8 bits, one word line driver WLDRV in those pair of small blocks 215 of the sectors 0, 1 by which the word line is shared. On the other hand, the "selection signal XB [7:0]" corresponds to the address signal A [5:3]. In this regard, eight word line drivers WLDRV connected to each even-numbered word line WL are selected from among the 64 word line drivers WLDRV [63-0] corresponding to one small block 215, by the selection signal XB [3:0] of 4 bits. Also, eight word line drivers WLDRV connected to each odd-numbered word line WL are selected from among the 64 word line drivers WLDRV [63-0] corresponding to one small block 215, by the other selection signal XB [7:4] of 4 bits.

Figure 10:
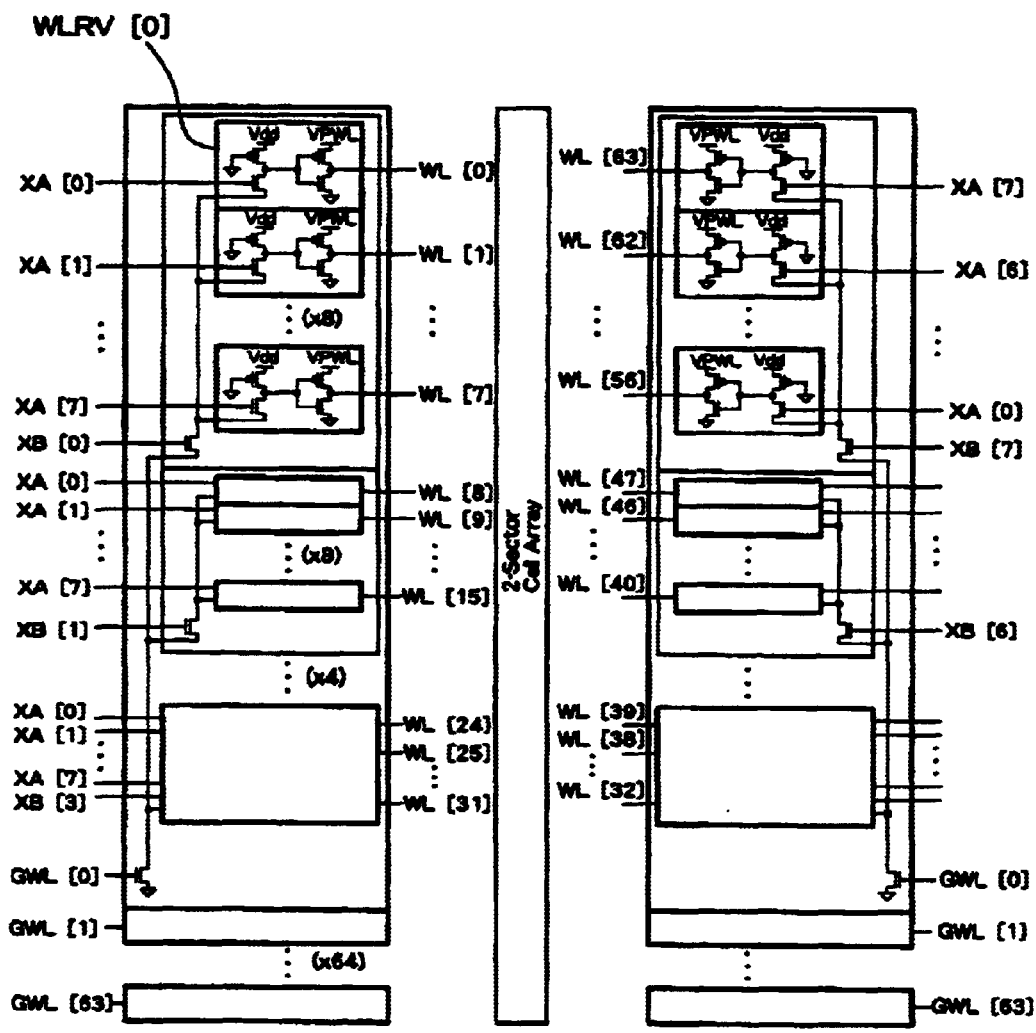
FIG. 10 is a circuit diagram showing an example of a word line driver WLDRV shown in FIG. 7.

In the case of the word line driver WLDRV [0] shown in FIG. 10, it supplies a potential VPWL to the word line WL [0] when all the signals GWL [0], XA [0] and XB [0] have become active, and it supplies a ground potential at any other time. The potential VPWL becomes a write potential in writing data, and becomes a read potential in reading data.

Next, there will be explained the bit line selecting high voltage VPBS [1:0] which is outputted from the 2-sector control circuit SEC2CTL.

Figure 11:
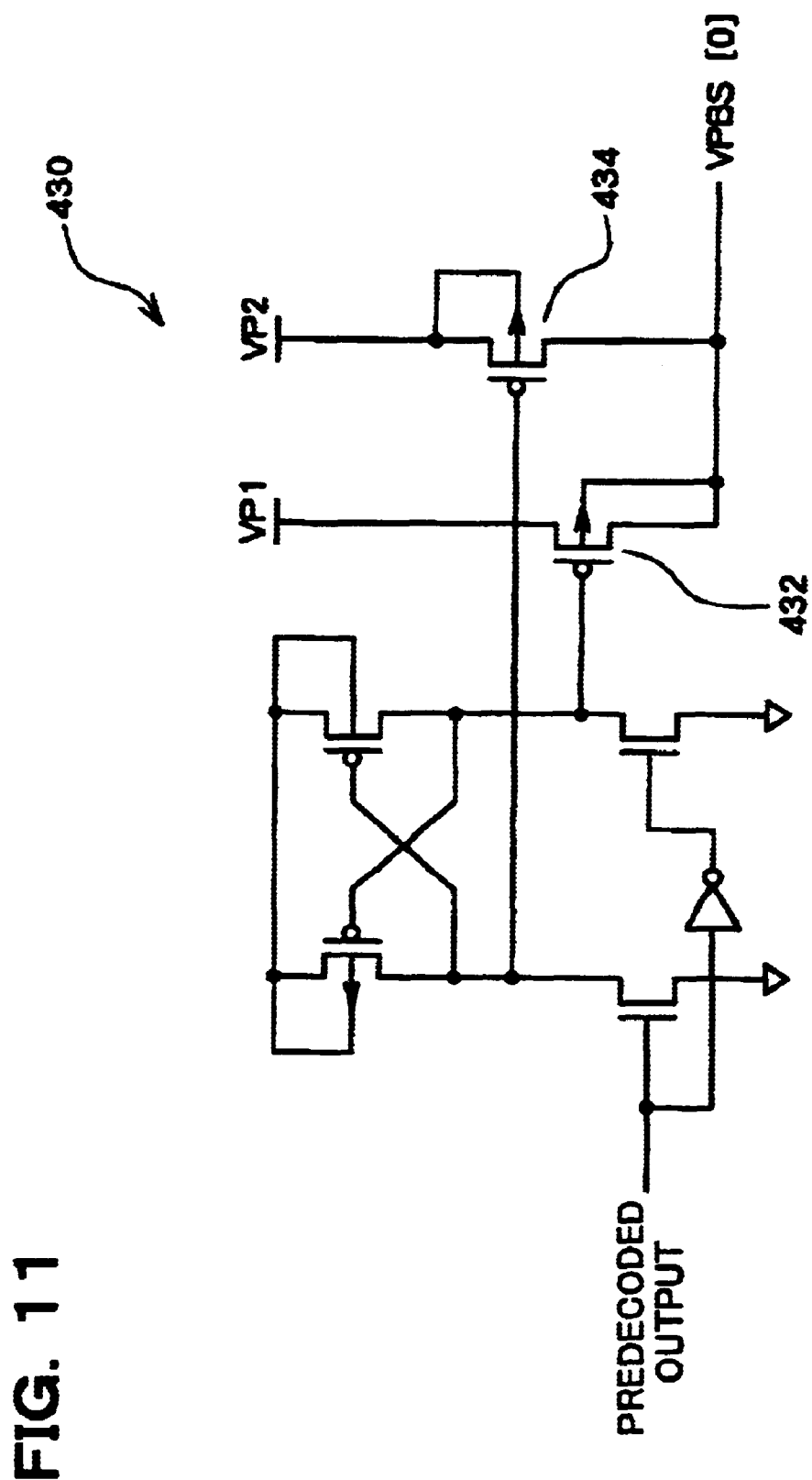
FIG. 11 is a circuit diagram showing an example of a bit-line-selection-voltage control circuit 430 which is included in a 2-sector control circuit SEC2CTL shown in FIG. 7.

As shown in FIG. 11, the 2-sector control circuit SEC2CTL includes a bit-line-selection voltage control circuit 430 which is constructed similarly to the control-gate-voltage control circuit EOCTL shown in FIG. 8.

FIG. 11 shows an example of the bit-line-selection voltage control circuit 430 which outputs the bit line selecting high voltage VPBS [0]. Referring to FIG. 11, when the predecoded output is HIGH, a P-type MOS transistor 432 turns OFF, and a P-type MOS transistor 434 turns ON, so that the voltage VP2 is outputted as the bit line selecting high voltage VPBS [0]. To the contrary, when the predecoded output is LOW, the P-type MOS transistor 432 turns ON, and the P-type MOS transistor 434 turns OFF, so that the voltage VP1 is outputted as the bit line selecting high voltage VPBS [0].

These voltages VP1, VP2 are also generated in correspondence with the respective modes by the booster circuits stated before. More specifically, VP1=Vdd (1.5V) and VP2= 4.5V, for example, hold in the data read mode, and VP1= VP2=8V, for example, holds in the data program mode and the data erase mode.

Figure 12:
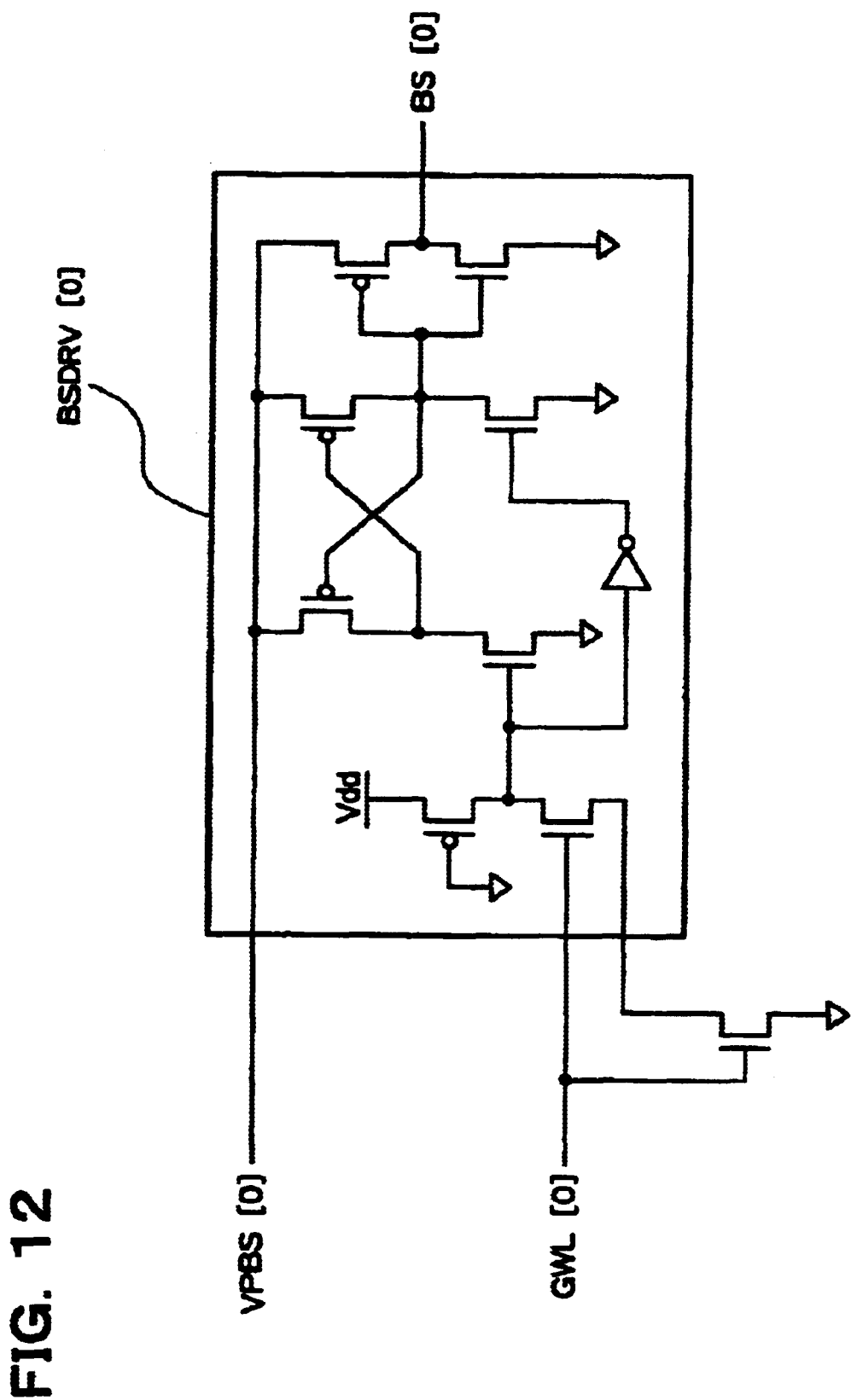
FIG. 12 is a circuit diagram showing an example of a bit line driver BSDRV [0] shown in FIG. 7.

Here, the bit line selection driver BSDRV [0] disposed in correspondence with the small block 0 in the sector 0 is shown in FIG. 12.

Referring to FIG. 12, the bit line selecting high voltage VPBS [0] and the global word line signal GWL [0] are inputted to the bit line selection driver BSDRV [0]. On condition that the global word line signal GWL [0] is HIGH, the bit line selecting high voltage VPBS [0] of the voltage VP1 or VP2 is outputted from the bit line selection driver BSDRV [0]. In any other case, the output of the bit line selection driver BSDRV [0] becomes 0V. This operation is also true of the other bit line selection drivers.

Description of Operations

Here will be described the operations of reading data, programming data and erasing data in the nonvolatile semiconductor storage device of this embodiment.

Figure 13:
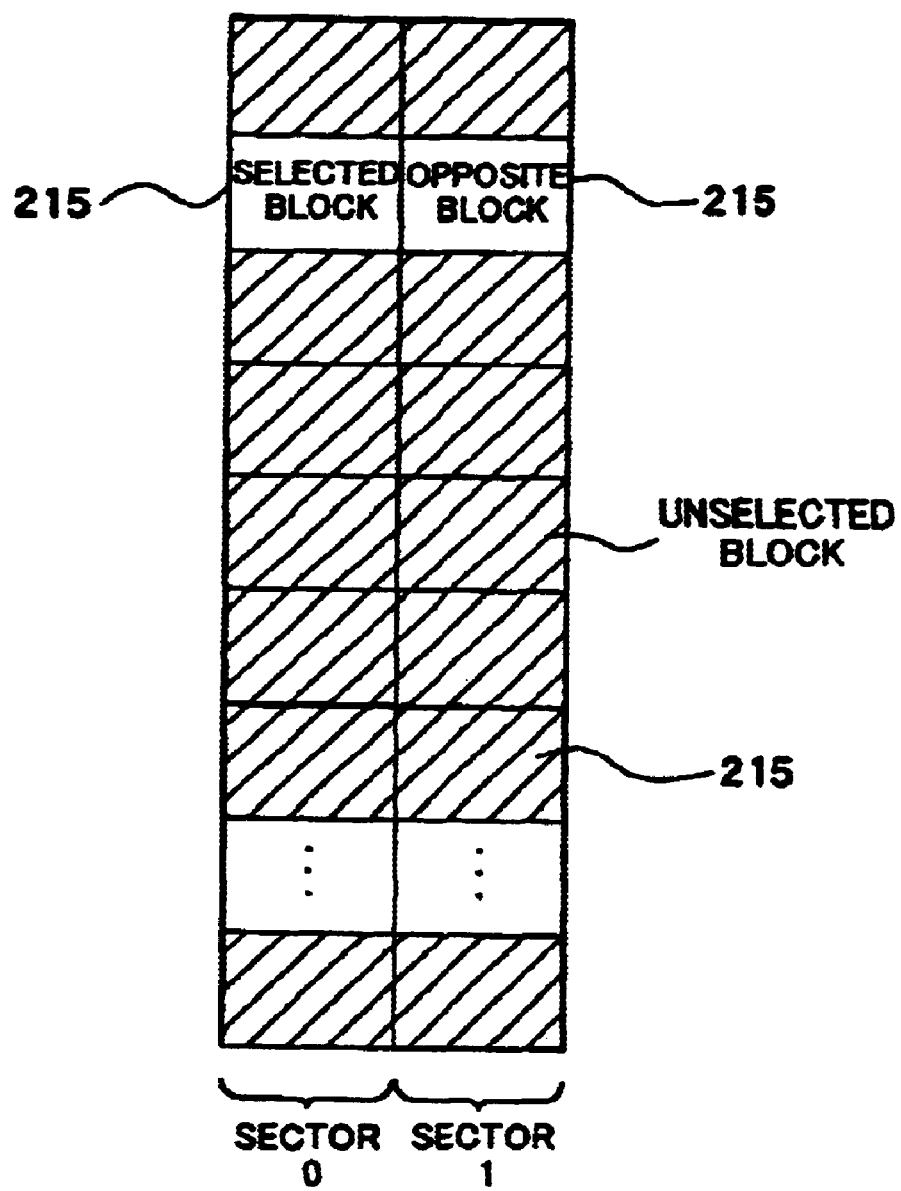
FIG. 13 is a schematic diagram explaining a selected block, an unselected opposite block opposing to the selected block, and the other unselected blocks.

In the ensuing description, there shall be used terms "selected block", "unselected opposite block" and "unselected block", which are the sorts of the names of the small blocks 215. In the case of one pair of sectors 0, 1 as shown in FIG. 13, the "selected block" signifies one small block 215 selected in the sector 0 by way of example. The "unselected opposite block" signifies that small block 215 in the sector 1 adjacent to the sector 0 which is adjacent to the selected block. The "unselected block" signifies any small block 215 other than the selected block and the opposite block in the sectors 0, 1 (and in the sectors 2 to 63).

Besides, the selected block in the read mode or the program mode includes therein a selected memory cell 100, and unselected memory cells 100. Further, the selected memory cell includes therein the memory element 108A or 108B of a selected cell, and the memory element 108B or 108A of an opposite cell.

Under the definitions given above, the potentials of the control gate line CG, bit line BL and word line WL in the read mode, program mode and erase mode will be indicated Table 2 and Table 3 below.

TABLE 2

| | | Selected Block | | | | | | | |
|---|---|---|---|---|---|---|---|---|---|
| | | Selected Twin MONOS Cell | | | | | Unselected Twin MONOS Cell | | |
| | | | Selected Cell | | Opposited Cell | | | | |
| Mode | BS | WL | BL | CG | BL | CG | WL | BL | CG |
| Read | 4.5 V (Opp. Side) Vdd (Sel. Side) | Vdd | 0 V | 1.5 V ± 0.1 V | sense | 3 V | Vdd or 0 V | sense or 0 V | 3 v or 1.5 V ± 0.1 V or 0 V |
| Program | 8 V | Approx. 1 V | 5 V | 5.5 V | Iprg = 5 uA (0 to 1 V) | 2.5 V | Approx. 1 V or 0 V | 5 V or Vdd or (0 to 1 V) | 5.5 V or 2.5 V or 0 V |
| Erase | 8 V | 0 V | 4.5 to 5 V | −1 to −3 V | 4.5 to 5 V | −1 to −3 V | | | |

TABLE 3

| | Opposite Block | | | | Unselected Block | | | |
|---|---|---|---|---|---|---|---|---|
| Mode | BS | WL | BL | CG | BS | WL | BL | CG |
| Read | 4.5 V (Opp. Side) Vdd (Sel. Side) | Vdd or 0 V | 0 V | 0 V | 0 V | 0 V | F | 0 V |
| Program | 8 V | Approx. 1 V or 0 V | 0 V | 0 V | 0 V | 0 V | F | 0 V |
| Erase | 8 V | 0 V | 0 V | 0 V | 0 V | 0 V | F | 0 V |

Now, the operations of the respective modes will be described in conjunction with Table 2 and Table 3.

Data Readout from Memory Cell

Figure 14:
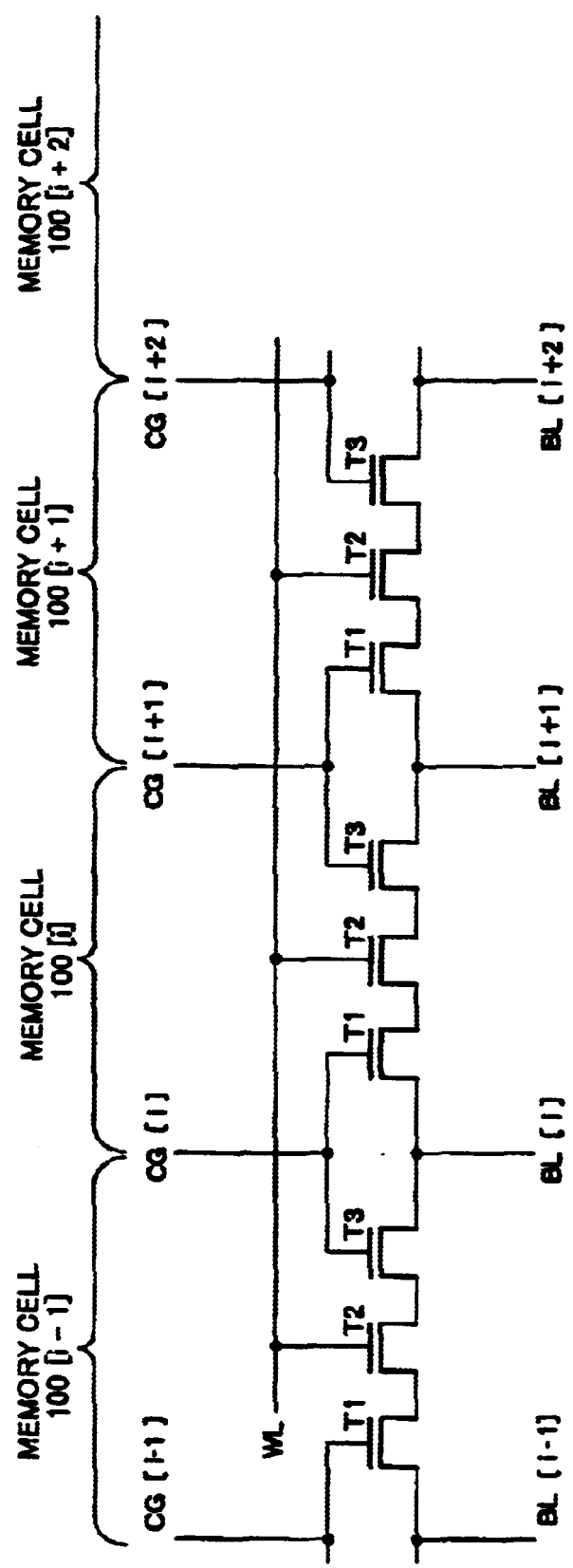
FIG. 14 is an equivalent circuit diagram of the memory cells shown in FIG. 1.

As shown in FIG. 14, one memory cell 100 can be modeled as a series connection consisting of a transistor T2 which is driven by the word gate 104, and transistors T1, T3 which are respectively driven by the first and second control gates 106A, 106B.

Figure 15:
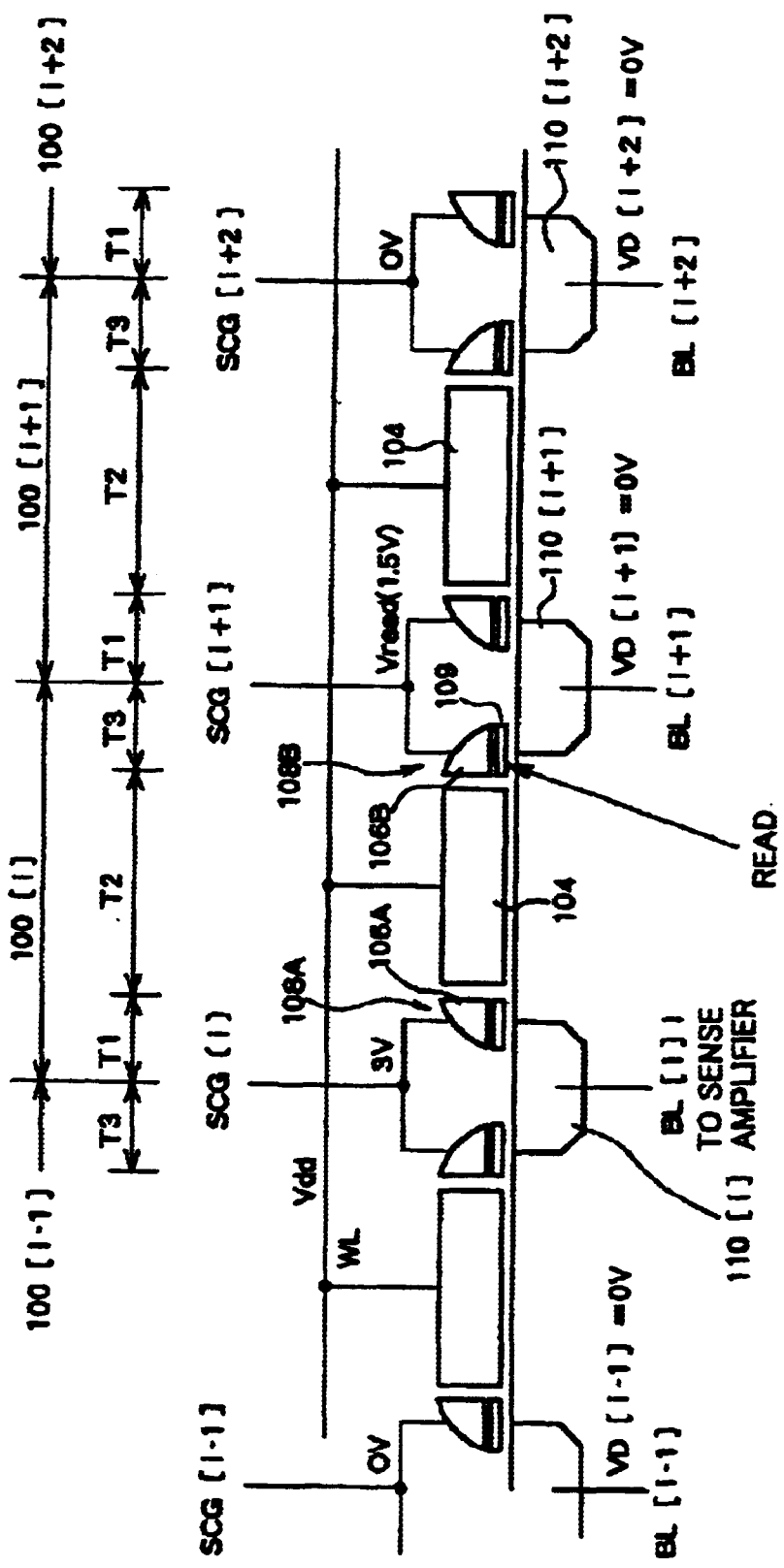
FIG. 15 is a schematic diagram explaining a data reading operation in the nonvolatile semiconductor storage device shown in FIG. 1.
Figure 16:
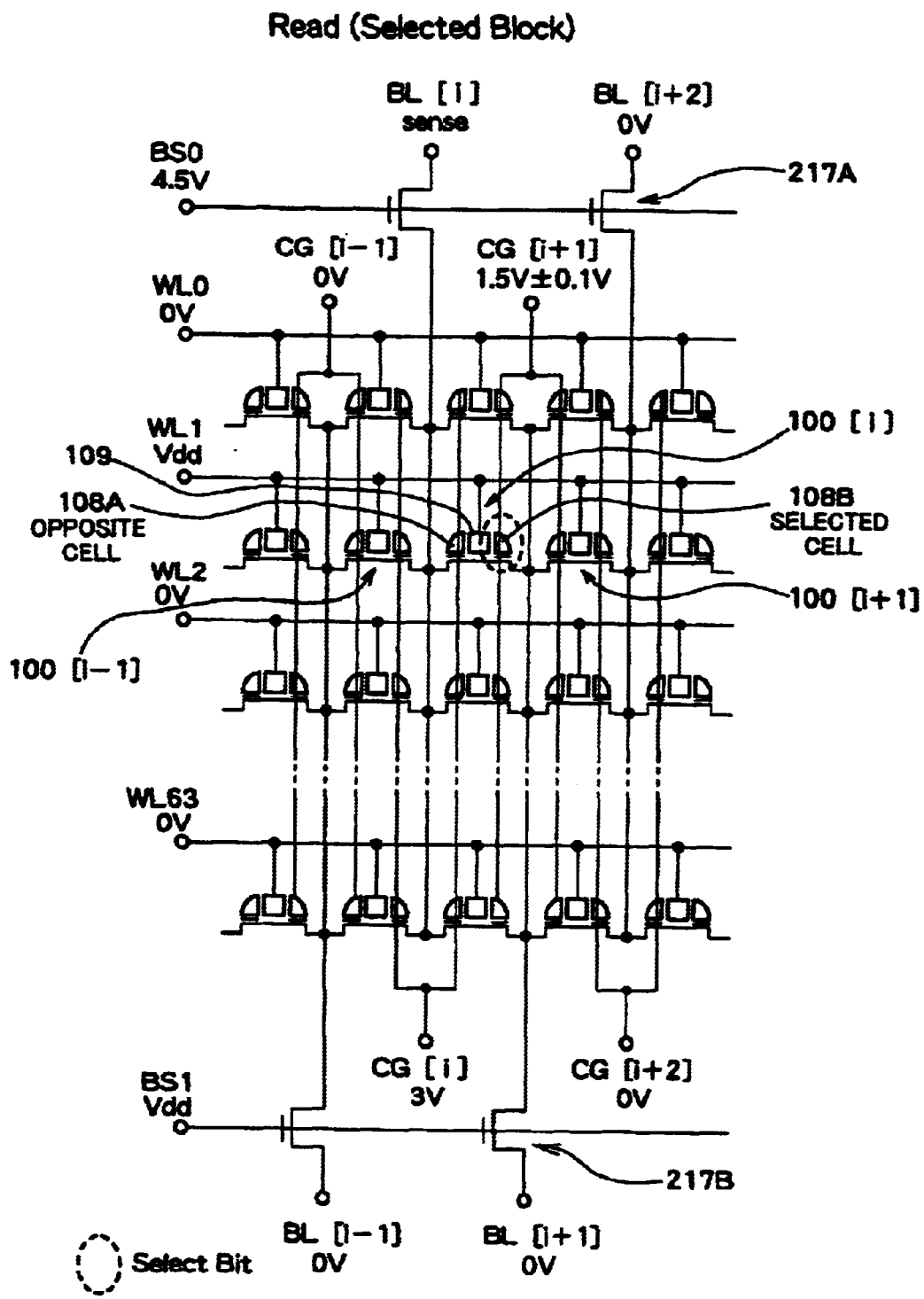
FIG. 16 is a schematic diagram explaining the settings of voltages within the selected block in the data read mode.

In describing the operation of the memory cell 100, there will be first explained the settings of the potentials of the various positions of the four memory cells 100 [i−1], [i], [i+1], [i+2] which are adjacent to one another in a certain selected block (selected small block 215) within, for example, the sector 0 as shown in FIG. 15. FIG. 15 is a diagram for explaining a case where data is read out in a reverse read mode from the MONOS memory element 108B (selected cell) on the right side of that word gate 104 of the memory cell 100 [i] which is connected to the word line WL1, while FIG. 16 shows the settings of voltages in the selected block on that occasion.

Here, the "reverse read" reads data by sensing current which flows through the bit line BL [i], by employing as a source the bit line BL [i+1] which is connected to the right selected cell 108B of the memory cell 100 [i], and as a drain the bit line BL [i] which is connected to the opposite cell 108A of the memory cell 100 [i].

The present invention can be applied also to forward read. In the case of the forward read, data is read by sensing current which flows through the bit line BL [i+1], by employing as a drain the bit line BL [i+1] which is connected to the right selected cell 108B of the memory cell 100 [i], and as a source the bit line BL [i] which is connected to the opposite cell 108A of the memory cell 100 [i].

The read operation will be described below by taking the reverse read as an example. In this case, the voltage Vdd (for example, 1.5V) is applied as a reading word line selection voltage to the word gate WL1 which lies at the same row as that of the memory cell 100 [i], thereby to turn ON the transistors T2 of that row. Besides, an override voltage (VP2 in FIG. 8=3V by way of example) is applied through the sub control gate line SCG [i] to the left control gate 106A (the opposite cell) of the memory cell 100 [i], thereby to turn ON the transistor T1 corresponding to the MONOS memory element 108A. A read voltage Vread (VP1 in FIG. 8=1.5V by way of example) is applied as the voltage VCG of the right control gate 106B of the memory cell 100 [i].

On this occasion, the operation of the transistor T3 corresponding to the MONOS memory element 108B is divided as stated below, depending upon whether or not charges are stored in the right MONOS memory element 108B (selected cell) of the word gate 104.

Figure 17:
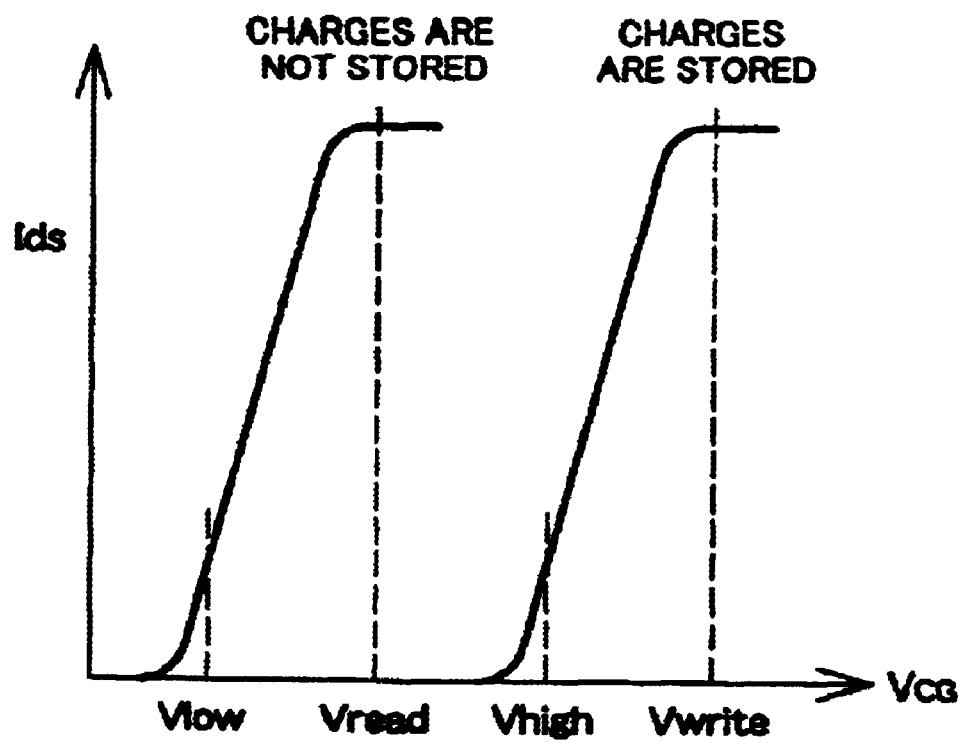
FIG. 17 is a characteristic diagram showing the relationships between a control gate voltage VCG and a source/drain current Ids in the memory cells shown in FIG. 1.

FIG. 17 shows the relationships between the applied voltage to the right control gate (the selected cell side) 106B of the memory cell 100 [i] and the current Ids flowing through the source/drain path of the transistor T3 corresponding to the MONOS memory element 108B (selected cell) which is controlled by the control gate 106B.

As shown in FIG. 17, in a case where no charges are stored in the MONOS memory element 108B (selected cell), the current Ids begins to flow when the control gate voltage VCG exceeds a low threshold voltage Vlow. In contrast, in a case where charges are stored in the MONOS memory element 108B (selected cell), the current Ids does not begin to flow unless the control gate potential VCG of the selected side exceeds a high threshold voltage Vhigh.

Here, the voltage Vread which is applied to the control gate 106B of the selected side in the data read mode is set at substantially the middle voltage between the two threshold voltages Vlow and Vhigh.

Accordingly, the current Ids flows in the case where no charges are stored in the MONOS memory element 108B (selected cell), and it does not flow in the case where the charges are stored in the MONOS memory element 108B (selected cell).

Here, as shown in FIG. 16, in the data read mode, the bit line BL [i] (impurity layer 110 [i]) connected to the opposite cell is connected to the sense amplifier, and the potentials VD [i−1], [i+1], [i+2] of the other bit lines BL [i−1], [i+1], [i+2] are respectively set at 0V. Thus, since the current Ids flows in the absence of the charges in the MONOS memory element 108B (selected cell), a current of, for example, at least 25 µA flows to the bit line BL [i] of the opposite side through the transistors T1, T2 in the ON states. In contrast, since the current Ids does not flow in the presence of the charges in the MONOS memory element 108B (selected cell), a current which flows to the bit line BL [i] connected to the opposite cell becomes less than, for example, 10 nA in spite of the ON states of the transistors T1, T2. Therefore, data can be read out of the MONOS memory element 108B (selected cell) of the memory cell 100 [i] in such a way that the current flowing to the bit line BL [i] of the opposite side is detected by the sense amplifier.

Note that in this embodiment, as shown in FIG. 16, the bit line selection transistors (N-type MOS transistors) 217A are respectively connected to the bit lines BL [i], [i+2], and the bit line selection transistors 217B to the bit lines BL [i−1], [i+1].

Each of these selection transistors 217A, 217B is difficult of holding its current drivability high, in relation to its size, and it has, for example, a channel width W=0.9 µm and a channel length L=0.8 µm in this embodiment.

Since the above current needs to be ensured for the bit line BL [i] connected to the sense amplifier, the gate voltage BS0 of the bit line selection transistor 217A is set at a high voltage of, for example, 4.5V (=VP2) by the circuit shown in FIG. 11.

On the other hand, the voltage of the source side of the MONOS memory element 108A of the selected side in FIG. 16 becomes a voltage close to 0V (on the order of several tens to several hundred mV). Consequently, the back gate of the bit line selection transistor 217B exerts little influence, and hence, the gate voltage BS1 thereof is set at the voltage Vdd (=VP1) by a circuit similar to the circuit in FIG. 11. Since this gate need not be supplied with the voltage of 4.5V, the load of the unshown booster circuit (charge pump) for generating the voltage of 4.5V can be lightened.

Assuming that the selected cell be the left nonvolatile memory element 108A of the memory cell 100 [i] in FIG. 16, the bit line BL [i] serves as a source in the reverse read, and the bit line BL [i+1] connected to the opposite cell 108B serves as a drain connected to the sense amplifier. In this case, therefore, the gate voltage BS0 of the bit line selection transistor 217A may be set at the voltage Vdd, and the gate voltage BS1 of the bit line selection transistor 217B at 4.5V.

Regarding the unselected cell in the selected block, voltages are set as listed in Table 2.

Figure 18:
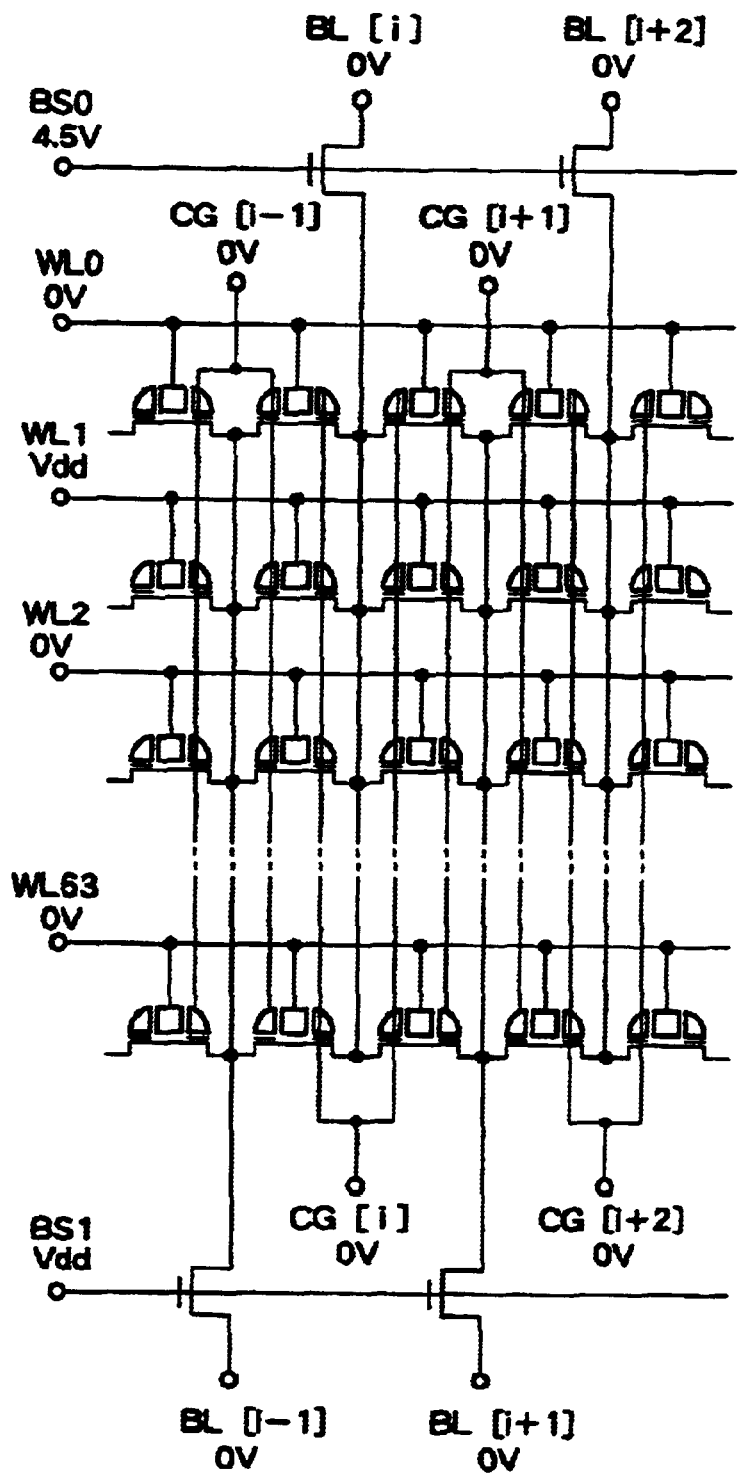
FIG. 18 is a schematic diagram explaining the settings of voltages within the unselected opposite block in the data read mode.

Next, in the opposite block (small block 215) within the sector 1 as opposes to the selected block within the sector 0, voltages are set as listed in Table 3, and the situation is shown in FIG. 18. Referring to FIG. 18, the voltages of the respective word lines WL and the gate voltages of the bit line selection transistors are shared by the sectors 0, 1, and they are therefore set at the same voltages as in the selected block shown in FIG. 16. The bit lines are all set at 0V.

Figure 19:
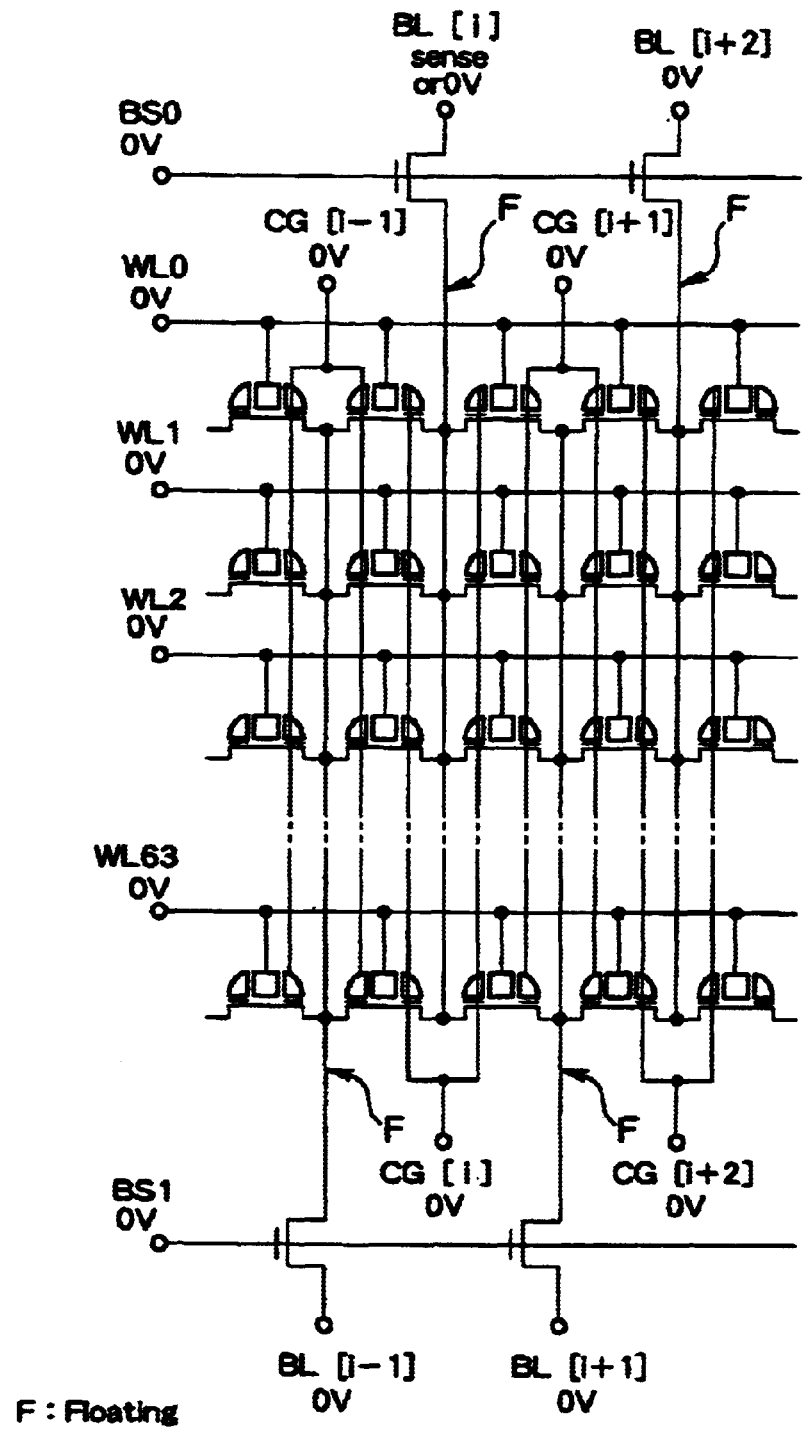
FIG. 19 is a schematic diagram explaining the settings of voltages within the unselected block except the opposite block, in the data read mode.

In each of the unselected blocks (small blocks 215) existing in the sectors 0 to 63, except the selected block and the opposite block, voltages are set as listed in Table 3, and the situation is shown in FIG. 19.

In the unselected block, any of the gate voltages of the bit line selection transistors 217A, 217B and the voltages of the word lines WL and control gate lines CG is set at 0V. Since the bit line selection transistors 217A, 217B are OFF, the bit lines BL fall into their floating states.

Programming of Memory Cell

Figure 20:
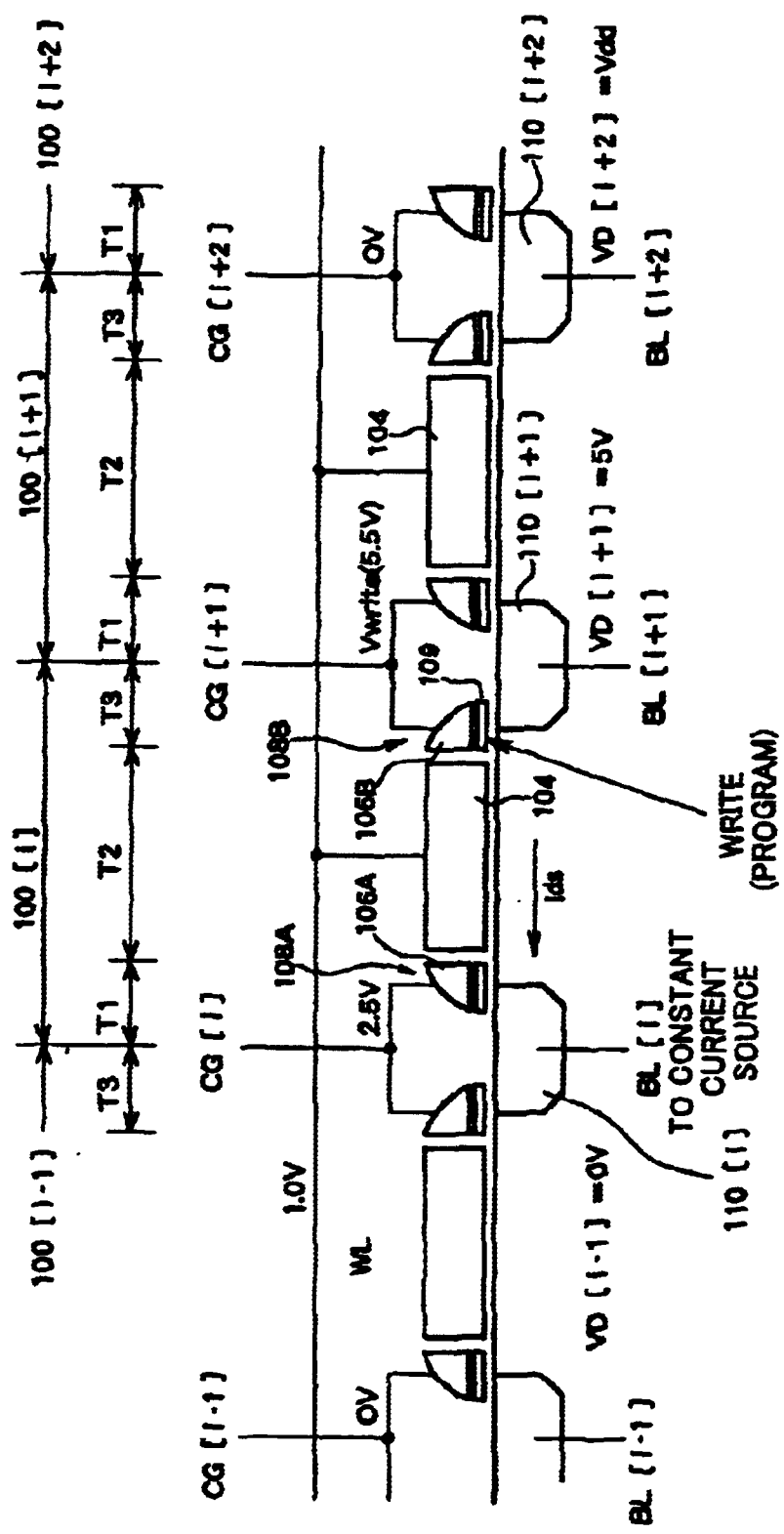
FIG. 20 is a schematic diagram explaining a data writing (programming) operation in the nonvolatile storage device shown in FIG. 1.
Figure 21:
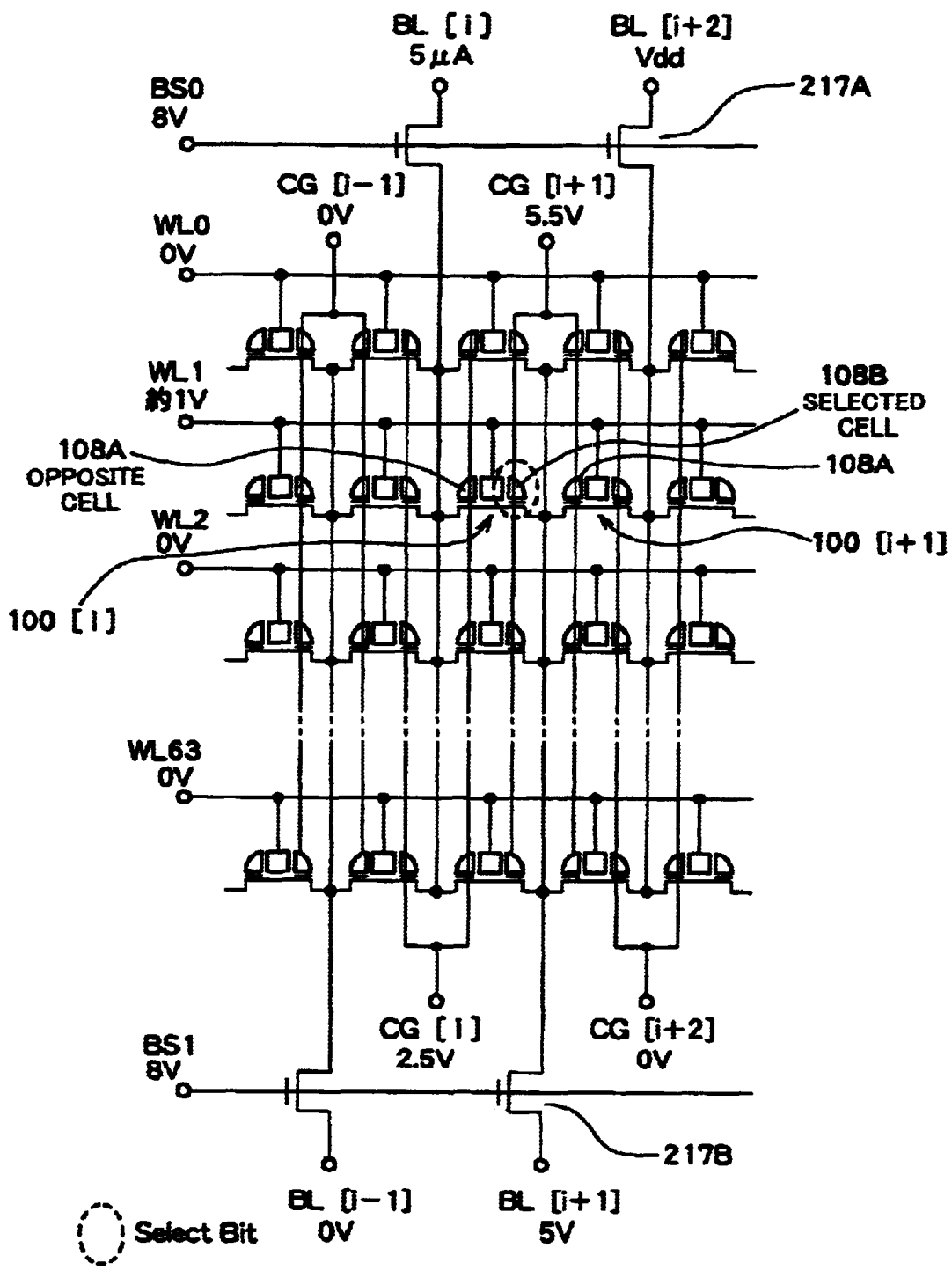
FIG. 21 is a schematic diagram explaining the settings of voltages within the selected block in the data program mode.

FIG. 20 is a diagram for explaining the data programming of the MONOS memory element 108B (selected cell) on the right side of the word gate 104 of the memory cell 100 [i] connected to the word line WL1, while FIG. 21 shows the situation of the settings of voltages in the selected block. The data programming operation is preceded by a data erasing operation which will be stated later.

In FIG. 20, as in FIG. 15, the potential of the sub control gate line SCG [i] is set at the override potential (VP1 in FIG. 8=2.5V by way of example), and the potentials of the sub control gate lines SCG [i−1], [i+2] are set at 0V. Here, the "override potential" is a potential which is required for causing a program current to flow by turning ON the transistor T1 correspondent to the left MONOS memory element 108A (opposite cell opposing to the selected cell) of the memory cell 100 [i], irrespective of whether or not the MONOS memory element 108A is to be programmed. Besides, the potentials of the word gates 104 in FIG. 21 are set at a programming word line selection voltage of, for example, about 1.0V lower than the supply voltage Vdd by the word line WL1. Further, the potential of the right control gate 108B (selected cell) of the memory cell 100 [i+1] is set at a write voltage Vwrite (VP2 in FIG. 8=5.5V by way of example) being a programming control gate voltage and shown in FIG. 4, through the sub control gate line SCG [i+1].

Figure 22:
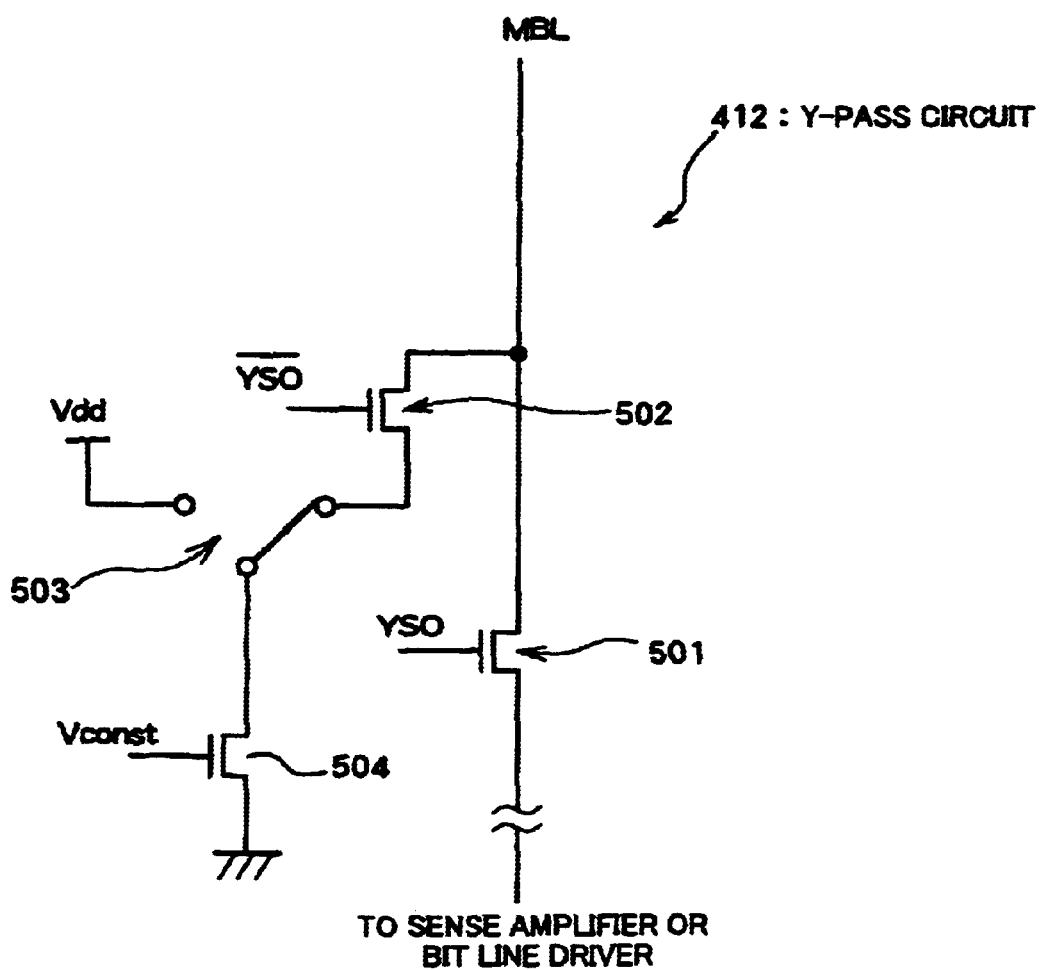
FIG. 22 is a circuit diagram schematically showing a Y-pass circuit which is connected to a bit line.

Next, the settings of the voltages of the bitline BL will be described with reference to FIG. 22. FIG. 22 schematically shows the interior of the Y-pass circuit 412 which is connected to the main bit line MBL.

Disposed in the Y-pass circuit 412 are a first transistor 501 for connecting the main bit line MBL to the sense amplifier or the bit line driver, and a second transistor 502 for connecting the same to any other path. Complementary signals YS0 and bar YS0 are respectively inputted to the first and second transistors 501 and 502.

The node of the supply voltage Vdd (1.8V), and a constant current source 504 for causing a constant current of, for example, 5 µA are disposed for the source of the second transistor 502 through a switch 503.

In the program mode, the voltage VD [i+1] of the bit line BL [i+1] in FIGS. 20 and 21 is connected to the bit line driver through the first transistor 501 in FIG. 22 and is set at, for example, 5V being a programming bit line voltage.

Besides, the bit line BL [i+2] is set at the voltage Vdd through the second transistor 502 and the switch 503 in FIG. 22.

Both the bit lines BL [i-1], [i] are connected to the constant current source 504 through the second transistor 502 and the switch 503 in FIG. 22. However, the MONOS cell connected to the bit line BL [i-1] turns OFF because of the 0V of its control gate line CG [i-1], and no current flows therethrough, so that it is set at 0V through the constant current source 504.

Thus, the transistors T1, T2 of the memory cell 100 [i] turn ON, respectively, and the current Ids flows toward the bit line BL [i], while at the same time, channel hot electrons (CHE) are trapped into the ONO film 109 of the MONOS memory element 108B. In this way, the programming operation of the MONOS memory element 108B is performed to write data "0" or "1".

On this occasion, there is also a method in which the programming word line selection voltage is set at 0.77V or so, not at about 1V, so as to bring the bit line BL [i] to 0V. In this embodiment, although the source/drain current is increased by raising the programming word line selection voltage to about 1V, the current which flows into the bit line BL [i] in the program mode is limited by the constant current source 504. Therefore, the voltage of the bit line BL [i] can be set at the optimum value (within a range of 0 to 1 V, and about 0.7V in this embodiment), and the programming operation can be optimally performed.

On account of the above operation, the voltage of 5.5V is applied also to the control gate of the right nonvolatile memory element 108A of the unselected memory cell 100 [i+1]. On this occasion, the right control gate CG [i+2] of the memory cell 100 [i+1] is set at 0V, so that any current does not essentially flow between the source and drain (between the bit lines) of the memory cell 100 [i+1]. Since, however, the voltage of 5V is applied to the bit line BL [i+1], any high electric field exerted between the source and drain (between the bit lines) of the memory cell 100 [i+1] causes a punch-through current to flow and gives rise to a write disturbance. Therefore, the write disturbance is prevented by setting the voltage of the bit line BL [i+2] at, for example, Vdd, not at 0V, and lessening the potential difference between the source and drain. Moreover, the voltage of the bit line BL [i+2] is set at the voltage which exceeds 0V, and which is preferably, at least, equal to the word line selection voltage in the program mode, whereby the transistor T2 of the memory cell [i+1] becomes difficult to turn ON. The disturbance can be prevented also this fact.

Besides, since the voltage of 5V needs to be supplied to the bit line BL [i+1], the voltage VP1=VP2=8V is applied to the gate of the bit line selection transistor 217B by a circuit similar to that shown in FIG. 11. On the other hand, the voltage of 8V (VP1=VP2=8V in FIG. 11) is similarly applied to the gate of the bit line selection transistor 217A. Since the bit line BL [i+2] needs to be set at Vdd for the above reason, a voltage higher than Vdd needs to be applied also to the gate of the transistor 217A, and hence, the same voltage of 8V as the gate voltage of the transistor 217B is used. Note that the gate voltage of the bit line selection transistor 217A may be higher than (Vdd+Vth).

Regarding the unselected cell in the selected block, voltages are set as listed in Table 2.

Figure 23:
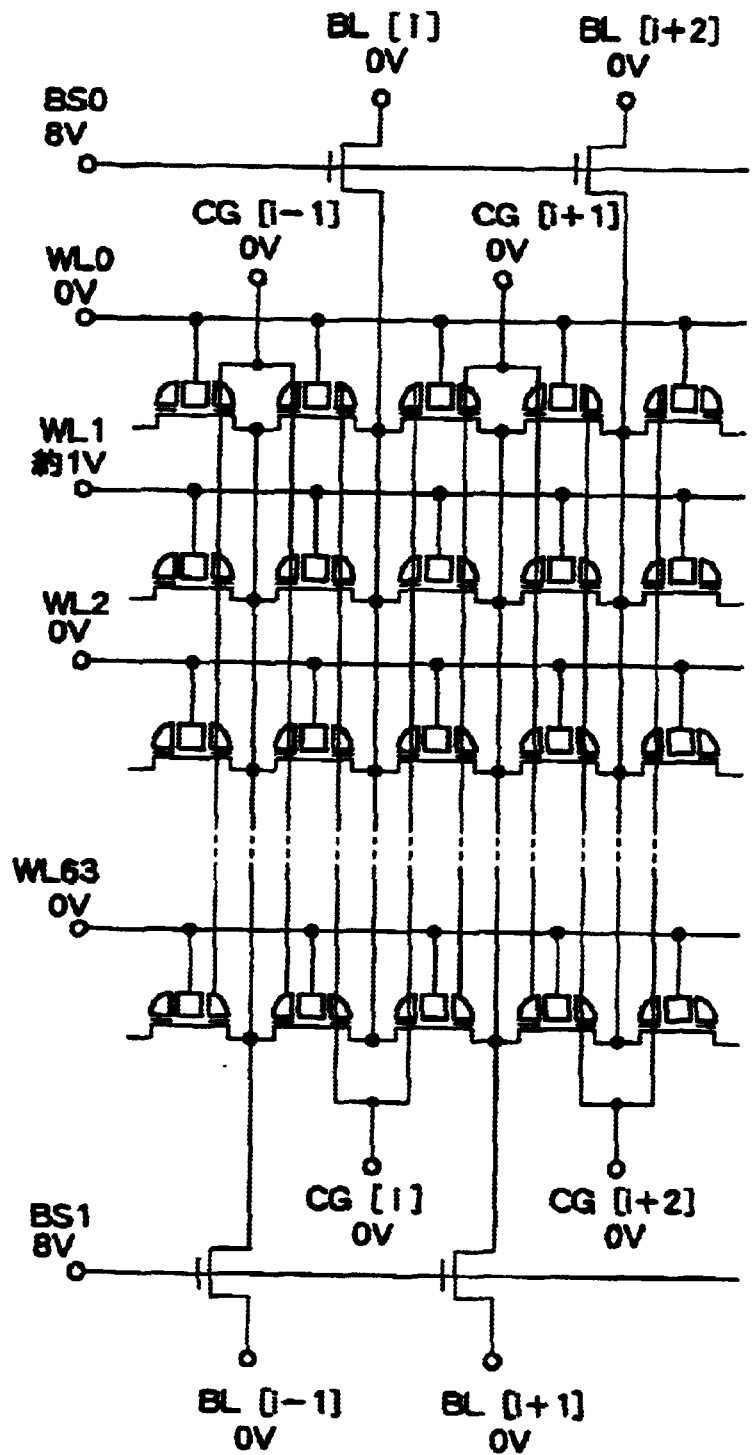
FIG. 23 is a schematic diagram explaining the settings of voltages within the unselected opposite block in the data program mode.

Next, in the opposite block (small block 215) within the sector 1 as opposes to the selected block within the sector 0, voltages are set as listed in Table 3, and the situation is shown in FIG. 23. Referring to FIG. 23, the voltages of the respective word lines WL and the gate voltages of the bit line selection transistors are shared by the sectors 0, 1, and they are therefore set at the same voltages as in the selected block shown in FIG. 20. The bit lines are all set at 0V.

Figure 24:
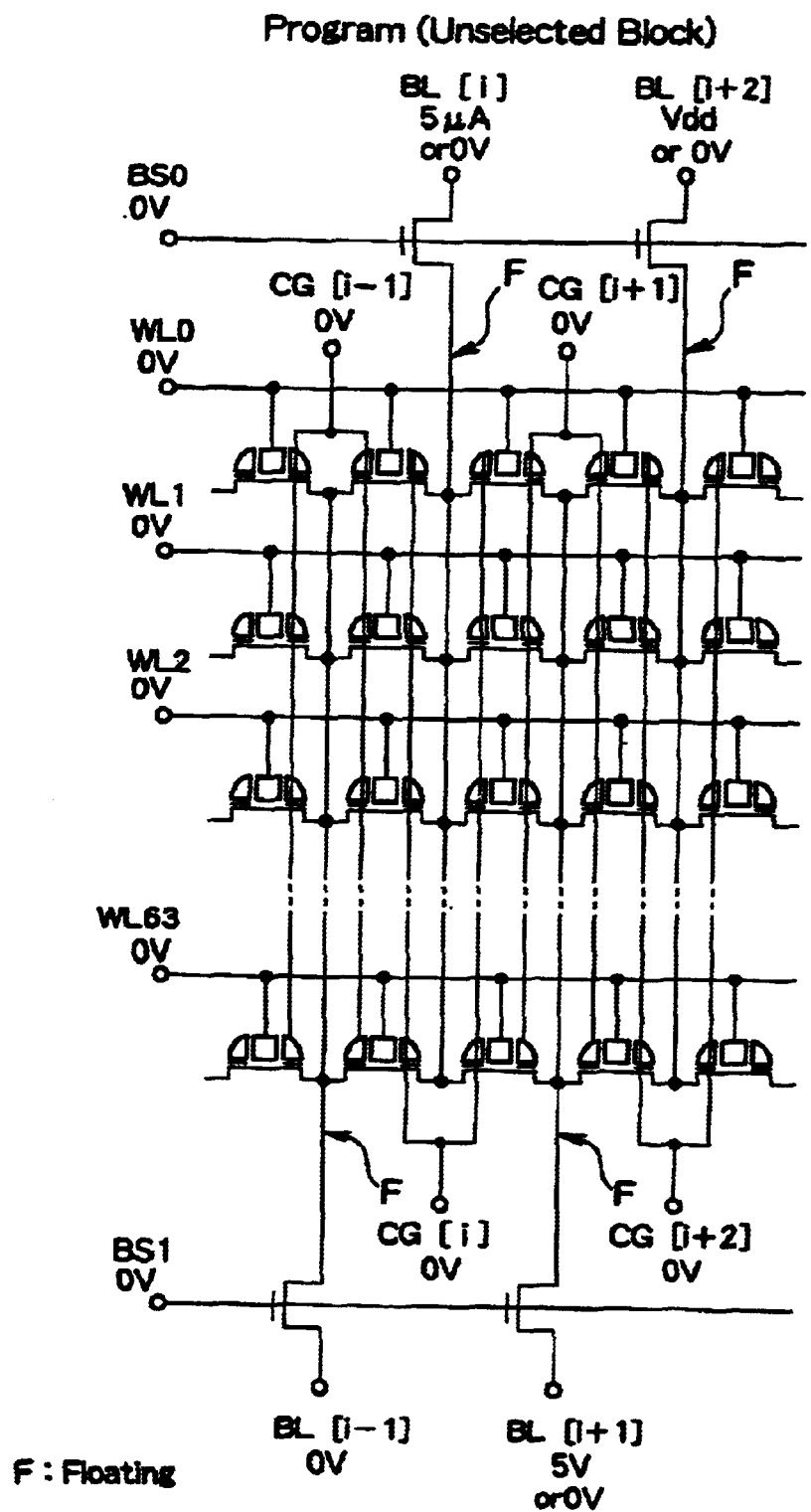
FIG. 24 is a schematic diagram explaining the settings of voltages within the unselected block except the opposite block, in the data program mode.

In each of the unselected blocks (small blocks 215) existing in the sectors 0 to 63, except the selected block and the opposite block, voltages are set as listed in Table 3, and the situation is shown in FIG. 24.

In the unselected block, any of the gate voltages of the bit line selection transistors 217A, 217B and the voltages of the word lines WL and control gate lines CG is set at 0V. Since the bit line selection transistors 217A, 217B are OFF, the bit lines BL fall into their floating states.

Figure 25:
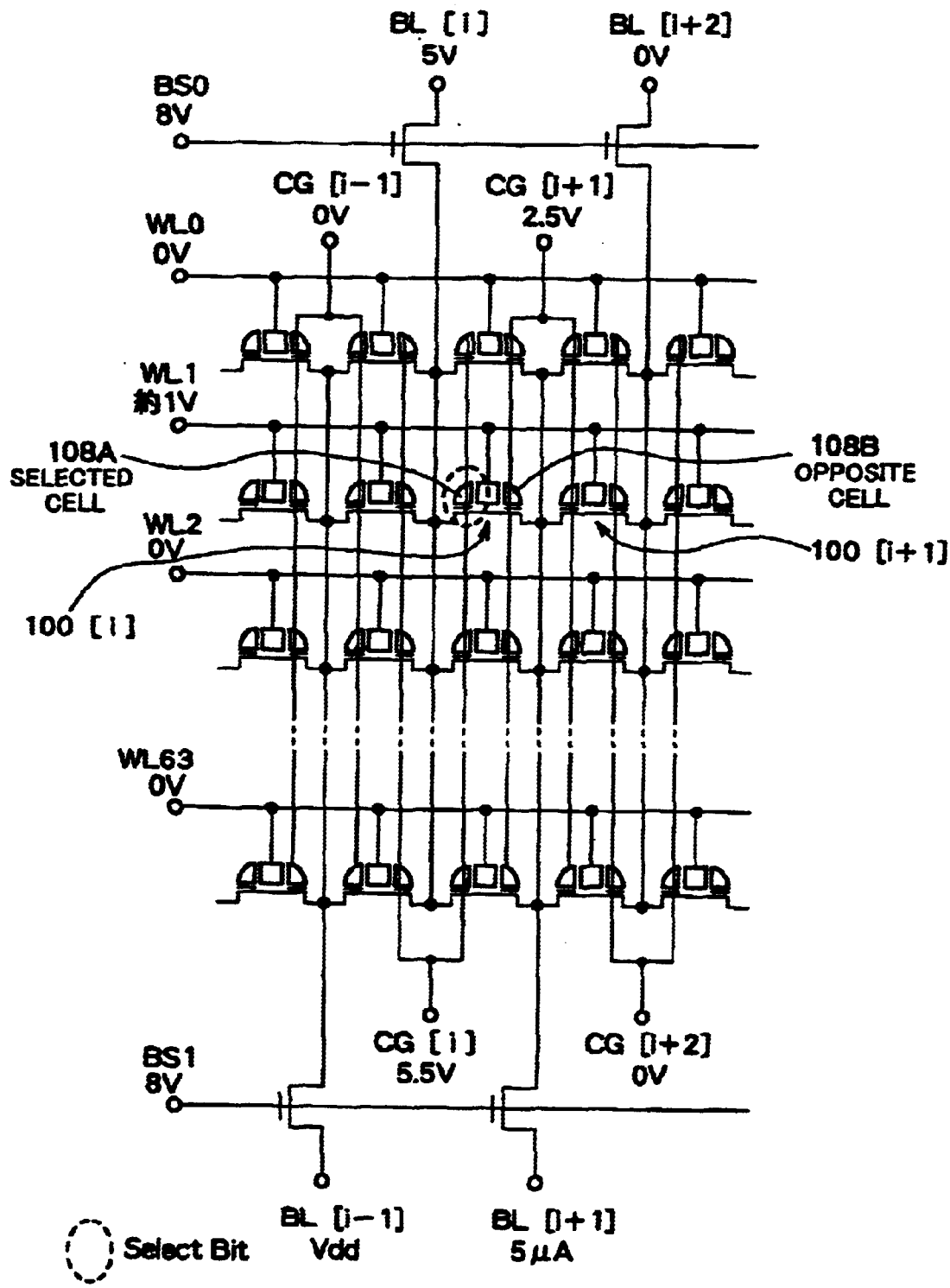
FIG. 25 is a schematic diagram explaining the settings of voltages within the selected block in the data program mode, for the memory element of the selected side differing from that in FIG. 21.

In order to program the left MONOS memory element 108A of the memory cell 100 [i], the potentials of the various positions of the memory cells 100 [i-1], [i], [i+1] may be set as shown in FIG. 25.

Data Erasing of Memory Cell

Figure 26:
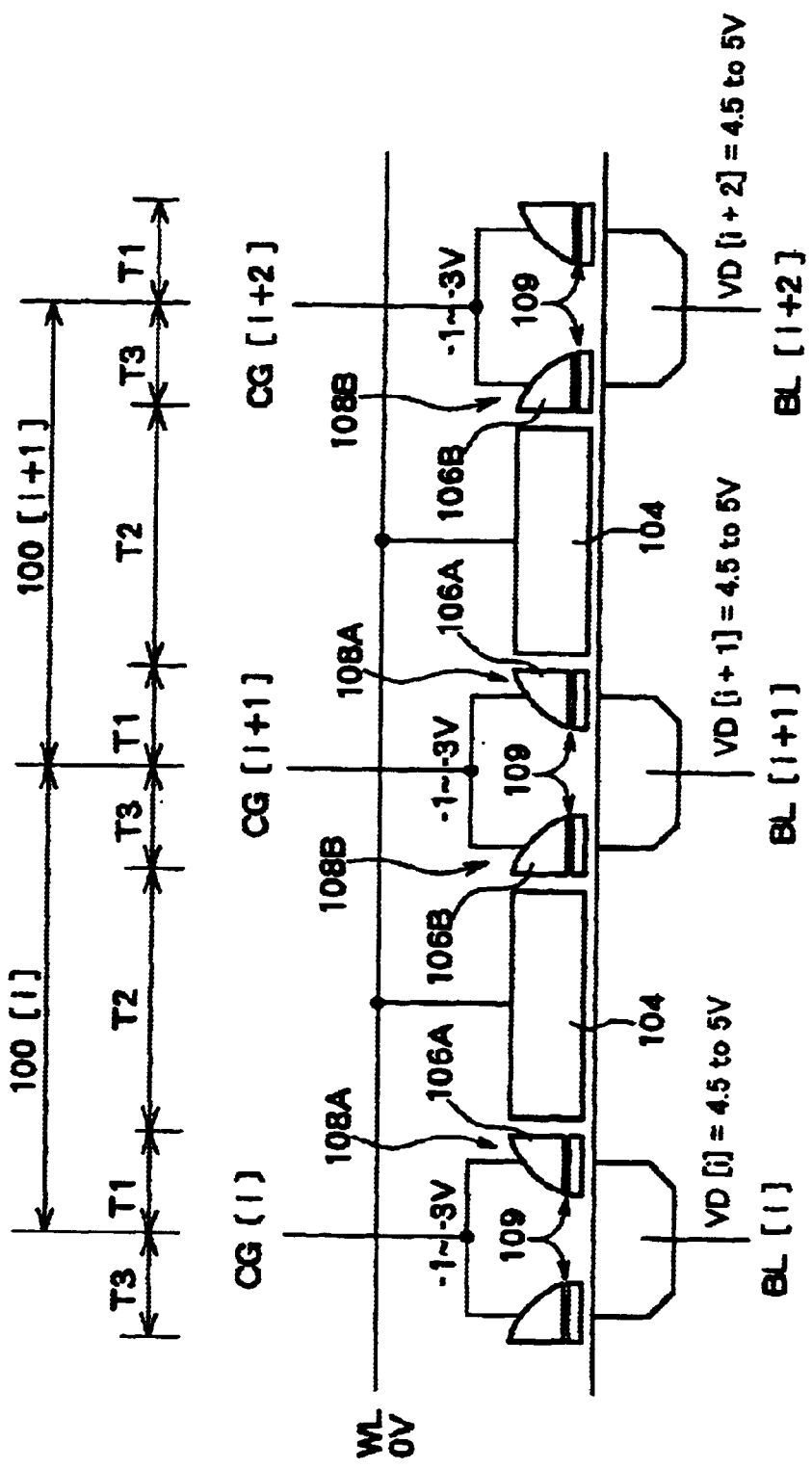
FIG. 26 is a schematic diagram explaining a data erasing operation in the nonvolatile storage device shown in FIG. 1.
Figure 27:
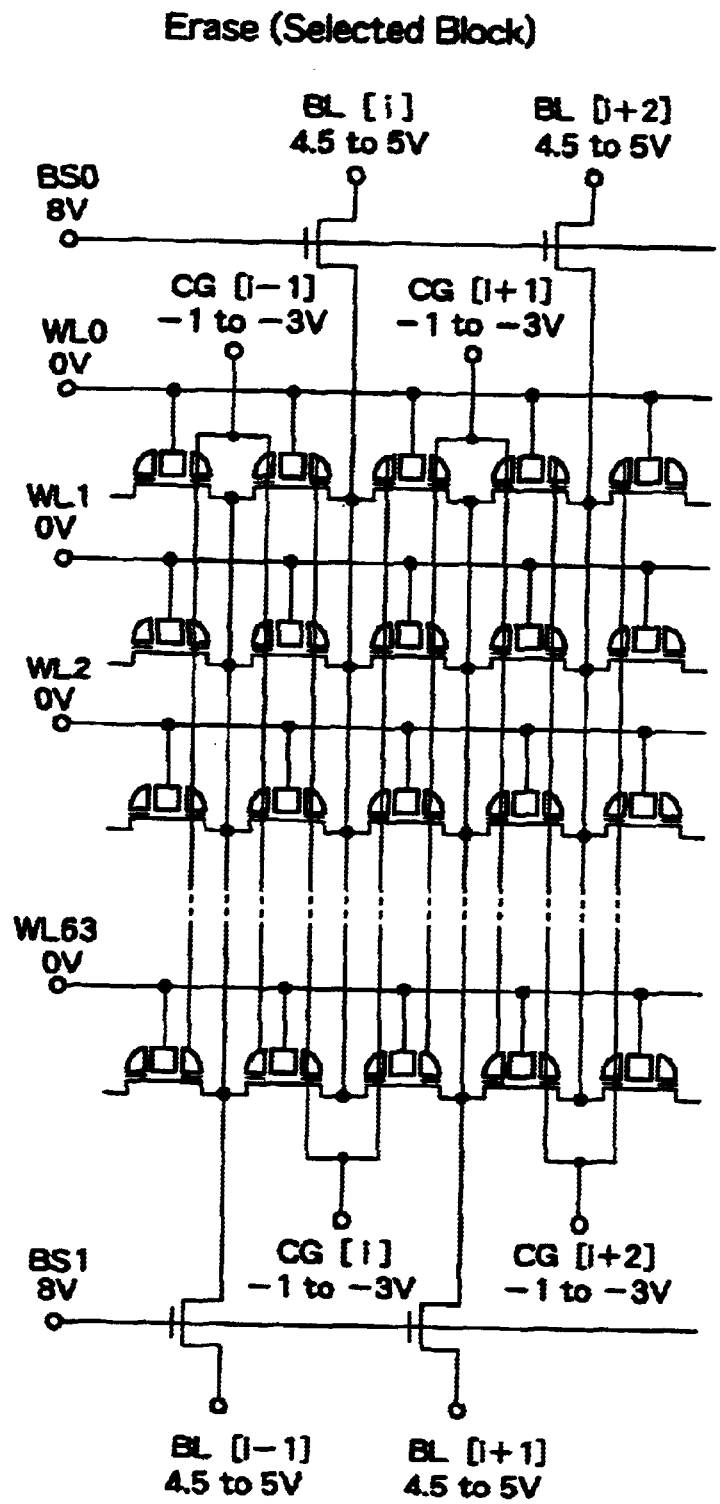
FIG. 27 is a schematic diagram explaining the settings of voltages within the selected block in the data erase mode.

FIG. 26 is a schematic diagram in the case of erasing data collectively from all the memory cells in the sector 0, and the situation of set voltages for some of the memory cells in the sector 0 is shown in FIG. 27.

Referring to FIG. 26, the potentials of the word gates 104 are set at 0V by the word line WL, and the potentials of the control gates 106A, 106B are set at an erasing control gate line voltage VNCG of, for example, -1V to -3V or so by the sub control gate lines SCG [i-1], [i], [i+1], [i+2]. Further, the potentials of the bit lines BL [i-1], [i], [i+1], [i+2] are set at an erasing bit line voltage of, for example, 4.5V to 5V by the bit line selection transistors 217A, 217B and the bit line drivers.

Thus, electrons having been trapped in the ONO films 109 of the MONOS memory elements 108A, 108B are extracted away by a tunnel effect based on an electric field which is formed by the erasing control gate voltage applied to the control gates, and the erasing bit line voltage applied to the bit lines. In this way, it is permitted to simultaneously erase data from the plurality of memory cells. Incidentally, an erasing operation may well be such that, unlike in the foregoing, hot holes are formed by band-band tunneling at the surfaces of impurity layers serving as bits, thereby to extinguish electrons having been stored.

Besides, the collective erasing of data within the sector is not restrictive, but data may well be erased in time division.

Figure 28:
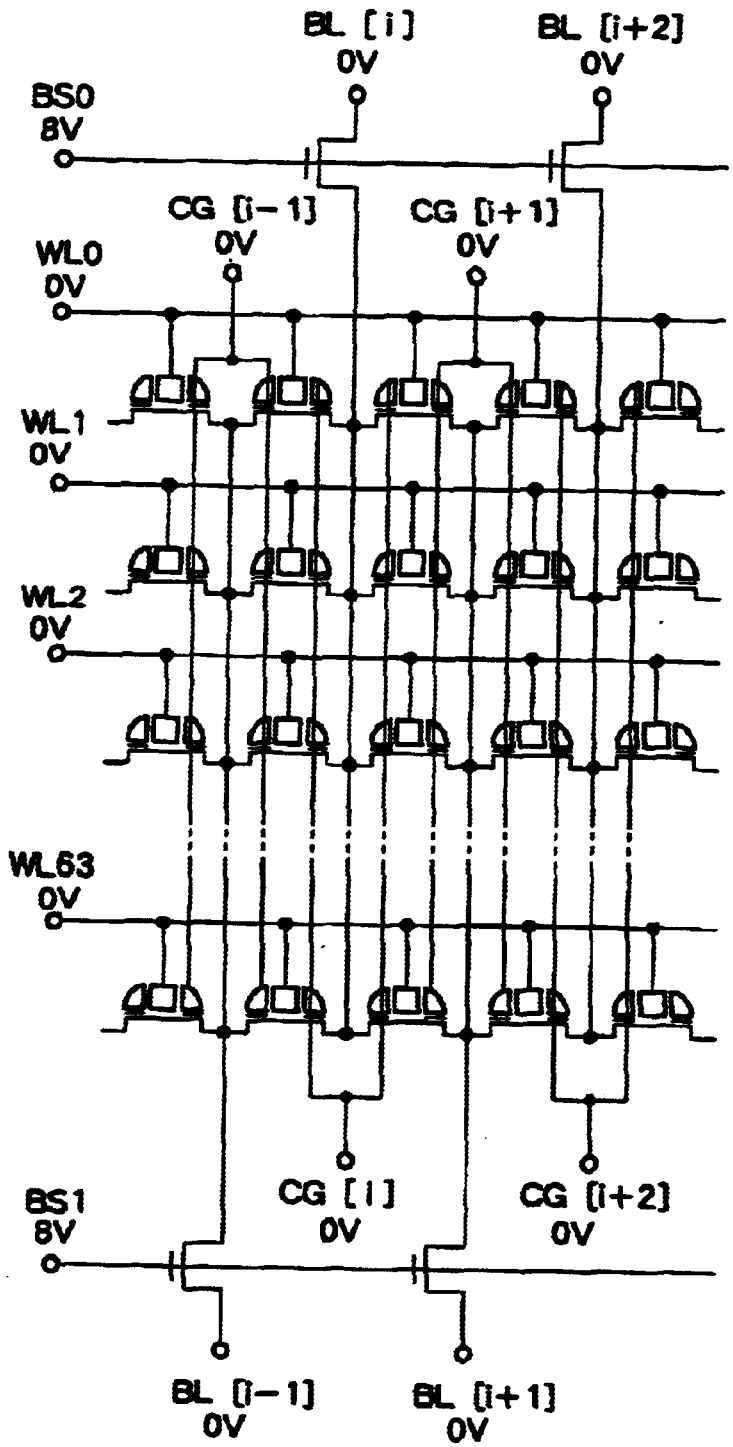
FIG. 28 is a schematic diagram explaining the settings of voltages within the unselected opposite block in the data erase mode.

Next, in the opposite block (small block 215) within the sector 1 as opposes to the selected block within the sector 0, voltages are set as listed in Table 3, and the situation is shown in FIG. 28. Referring to FIG. 28, the voltages of the respective word lines WL and the gate voltages of the bit line selection transistors are shared by the sectors 0, 1, and they are therefore set at the same voltages as in the selected block shown in FIG. 24. The bit lines are all set at 0V. In the cells within the opposite block, both the control gate line CG and the bit line BL are 0V, so that no disturbance occurs.

Figure 29:
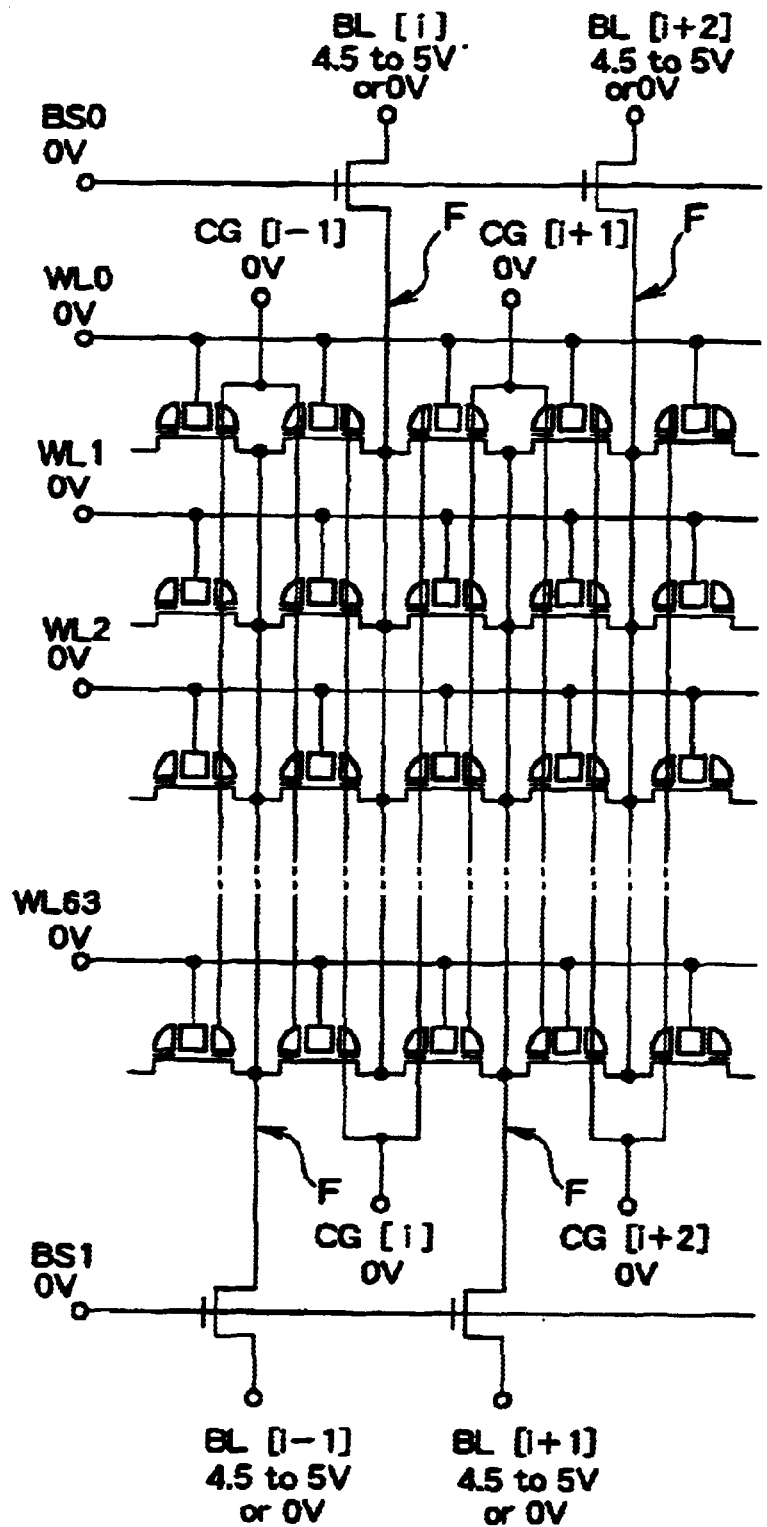
FIG. 29 is a schematic diagram explaining the settings of voltages within the unselected block except the opposite block, in the data erase mode.

In each of the unselected blocks (small blocks 215) existing in the sectors 0 to 63, except the selected block and the opposite block, voltages are set as listed in Table 3, and the situation is shown in FIG. 29.

In the unselected block, any of the gate voltages of the bit line selection transistors 217A, 217B and the voltages of the word lines WL and control gate lines CG is set at 0V. Since the bit line selection transistors 217A, 217B are OFF, the bit lines BL fall into their floating states. Since, however, the voltages of the bit lines BL are very close to 0V, no disturbance occurs in the cells within the unselected block.

Note that the present invention is not restricted to the foregoing embodiment, but it can be variously modified within the scope of the purport thereof.

By way of example, the structure of the nonvolatile memory elements 108A, 108B is not restricted to the MONOS structure. The present invention is applicable to a nonvolatile semiconductor storage device employing any of other various memory cells each of which can trap charges independently in two portions by one word gate 104 and first and second control gates 106A and 106B.

Besides, the dividing number of each sector area, the dividing numbers of each large block and each small block, and the number of the memory cells in each small memory block are mere examples in the foregoing embodiment, and other various modifications are possible. The dividing number of each large block has been determined to be eight from the restriction of a metal wiring pitch. If the metal wiring pitch can be narrowed, the dividing number can be increased more. By way of example, when each large block is divided by 16, the load capacitance (gate capacitance) of one control gate line decreases still further, and hence, a drive of higher speed becomes possible. Since, however, the number of the main control gate lines increases due to the division by 16, it is unavoidable to narrow the lines and spaces or to enlarge a device area. Moreover, since also the number of the control gate drivers increases, an area enlarges to that extent.

What is claimed is:

1. A nonvolatile semiconductor storage device comprising:
  a memory cell array region in which a plurality of memory cells are arranged in a first direction and a second direction intersecting with each other, each of the memory cells having first and second nonvolatile memory elements and being controlled by one word gate and first and second control gates;
  a plurality of sub bit lines which extend in the first direction and are disposed in a plurality of block areas formed by dividing the memory cell array region in the first direction, each of the sub bit lines being connected with the first nonvolatile memory element of one of two the memory cells adjacent each other in the second direction and the second nonvolatile memory element of the other of the two memory cells;
  a plurality of main bit lines which are formed extending over the plurality of block areas arranged in the first direction, each of the main bit lines being connected in common to the plurality of sub bit lines respectively disposed in the block areas arranged in the first direction;
  a plurality of bit line selection switching elements which are respectively disposed at connection points between the main bit lines and the sub bit lines, and select connection or non-connection based on a control voltage; and
  a bit line selection driver which supplies the control voltage to the bit line selection switching elements,
  wherein the plurality of bit line selection switching elements include a first group of bit line selection switching elements and a second group of bit line selection switching elements, respectively connected with every second line among the sub bit lines arranged in the second direction,
  wherein the bit line selection driver include a first bit line selection driver which supplies a first control voltage to the first group of bit line selection switching elements, and a second bit line selection driver which supplies a second control voltage to the second group of bit line selection switching elements,
  wherein the first bit line selection driver supplies the first group of bit line selection switching elements with the first control voltage that is set to be lower than the second control voltage when data is read out of one of the first and second nonvolatile memory elements, and a bit line selection switching element connected to the sub bit line serving as a source of selected one of the memory cells is included in the first group of bit line selection switching elements, and
  wherein the second bit line selection driver supplies the second group of bit line selection switching elements with the second control voltage that is set to be lower than the first control voltage when data is read out of the other of the first and second nonvolatile memory elements, and a bit line selection switching element connected to the sub bit line serving as a source of selected one of the memory cells is included in the second group of bit line selection switching elements.

2. The nonvolatile semiconductor storage device as defined by claim 1,
  wherein data is read out in a reverse read mode by using a source which is the sub bit line connected to a selected element between the first and second nonvolatile memory elements, the data being read out of the selected element, and by using a drain which is the sub bit line connected to an unselected element between the first and second nonvolatile memory elements, the data not being read out of the unselected element.

3. The nonvolatile semiconductor storage device as defined by claim 1,
  wherein data is read out in a forward read mode by using a drain which is the sub bit line connected to a selected element between the first and second nonvolatile memory elements, the data being read out of the selected element, and by using a source which is the sub bit line connected to an unselected element between the first and second nonvolatile memory elements, the data not being read out of the unselected element.

4. The nonvolatile semiconductor storage device as defined by claim 1, wherein each of the first and second nonvolatile memory elements includes an ONO film formed of an oxide film (O), a nitride film (N) and an oxide film (O), as a trap site for electric charges, and data is programmed in the trap site.

5. The nonvolatile semiconductor storage device as defined by claim 1, wherein between the first and second control voltages, a lower voltage is set at a supply voltage, and a higher voltage is set at a voltage generated by boosting the supply voltage.

6. The nonvolatile semiconductor storage device as defined by claim 5, further comprising a bit line selection voltage control circuit which supplies the first and second control voltages to the first and second bit line selection drivers, respectively.

7. The nonvolatile semiconductor storage device as defined by claim 6, further comprising:

a predecoder which predecodes an address signal for specifying one of the first and second nonvolatile memory elements from which data is to be read out, wherein the bit line selection voltage control circuit sets each of the first and second control voltages at one of the lower voltage and the higher voltage in accordance with a predecoded output from the predecoder.

8. The nonvolatile semiconductor storage device as defined by claim 7, wherein each of the first and second bit line selection drivers is disposed in respective one of the plurality of block areas arranged in the first direction, and wherein the bit line selection voltage control circuit supplies the first and second control voltages to the first and second bit line selection drivers, respectively.

9. The nonvolatile semiconductor storage device as defined by claim 8, further comprising:

a global decoder which collectively selects the block areas arranged in the second direction, based on the predecoded output delivered from the predecoder, wherein the first and second bit line selection drivers supply the first and second control voltages to the first and second groups of bit line selection switching elements, respectively, when a decoded output from the global decoder is active.

10. The nonvolatile semiconductor storage device as defined by claim 1, wherein the first and second bit line selection drivers are respectively arranged in local driver areas which are adjacent to the block areas in the second direction.

11. The nonvolatile semiconductor storage device as defined by claim 10, wherein an odd-numbered block area and an even-numbered block area among the block areas arranged in the second direction are disposed adjacent each other between two of the local driver areas among the local driver areas arranged in the second direction.

12. The nonvolatile semiconductor storage device as defined by claim 11, wherein the first group of bit line selection switching elements and the second groups of bit line selection switching elements are respectively connected to every second line among the sub bit lines arranged in the second direction in the odd-numbered block area and the even-numbered block area, wherein the first bit line selection driver, which drives the first groups of bit line selection switching elements, is disposed in one of the local driver areas which is adjacent to the odd-numbered block area, and wherein the second bit line selection driver, which drives the second groups of bit line selection switching elements, is disposed in another of the local driver areas which is adjacent to the even-numbered block area.

* * * * *